US009972229B2

(12) United States Patent
Hemiller et al.

(10) Patent No.: US 9,972,229 B2
(45) Date of Patent: *May 15, 2018

(54) DISPLAY MODULE MOUNTING

(71) Applicant: Daktronics, Inc., Brookings, SD (US)

(72) Inventors: Ryan Hemiller, Brookings, SD (US); Ryan J. Nielsen, Brookings, SD (US); Shannon Lee Mutschelknaus, Aurora, SD (US)

(73) Assignee: Daktronics, Inc., Brookings, SD (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/448,328

(22) Filed: Mar. 2, 2017

(65) Prior Publication Data

US 2017/0178549 A1 Jun. 22, 2017

Related U.S. Application Data

(63) Continuation of application No. 13/928,968, filed on Jun. 27, 2013, now Pat. No. 9,612,004.

(Continued)

(51) Int. Cl.
| | |
|---|---|
| *G09F 9/302* | (2006.01) |
| *H05K 1/18* | (2006.01) |
| *H05K 7/14* | (2006.01) |

(52) U.S. Cl.
CPC ........... *G09F 9/3026* (2013.01); *H05K 1/181* (2013.01); *H05K 7/14* (2013.01); *H05K 2201/10106* (2013.01)

(58) Field of Classification Search
CPC .......... F21V 21/34; G09F 9/3026; H05K 7/14

(Continued)

(56) References Cited

U.S. PATENT DOCUMENTS 5,465,191 A * 11/1995 Nomura ................... E05C 1/10
 292/145
6,813,853 B1 11/2004 Tucker
(Continued)

FOREIGN PATENT DOCUMENTS

| AU | 2013280275 | 3/2017 |
|---|---|---|
| AU | 2013280215 B2 | 7/2017 |

(Continued)

OTHER PUBLICATIONS

"U.S. Appl. No. 15/446,814, Response filed Sep. 18, 2017 to Non Final Office Action dated Jun. 16, 2017", 12 pgs.

(Continued)

*Primary Examiner* — William N Harris
(74) *Attorney, Agent, or Firm* — Schwegman Lundberg & Woessner, P.A.

(57) ABSTRACT

Display module mounting configurations and methods are disclosed. A frame for a video display module can comprise a first face configured for coupling with a light-emitting element circuit board and a second face configured for mounting to a support chassis and one or more first securing structures coupled to the second face, the one or more first securing structures being configured to mount or secure the frame to the support chassis. The frame can also include one or more security latches each comprising a latch body movable between a latched position and an unlatched position, each latch body configured to engage a first feature of the support chassis to prevent removal of the video display module when in the latched position.

19 Claims, 24 Drawing Sheets

Related U.S. Application Data

(60) Provisional application No. 61/665,579, filed on Jun. 28, 2012, provisional application No. 61/754,043, filed on Jan. 18, 2013.

(58) Field of Classification Search
USPC .................................. 248/681, 140, 408
See application file for complete search history.

(56) References Cited

U.S. PATENT DOCUMENTS

| | | | |
|---|---|---|---|
| 6,816,389 B1 | 11/2004 | Lutz et al. | |
| 6,950,313 B1* | 9/2005 | Shih ................. | H05K 7/1408 361/679.31 |
| 7,055,271 B2* | 6/2006 | Lutz .................... | G09F 7/18 40/452 |
| 7,864,516 B2 | 1/2011 | Lee et al. | |
| 8,104,204 B1 | 1/2012 | Syrstad | |
| 8,154,864 B1 | 4/2012 | Nearman et al. | |
| 8,197,088 B2 | 6/2012 | Patterson et al. | |
| 8,414,149 B2 | 4/2013 | Nearman | |
| 9,644,823 B2 | 5/2017 | Hemiller et al. | |
| 2003/0217495 A1* | 11/2003 | Nagamine ............. | G09F 9/00 40/605 |
| 2005/0052374 A1 | 3/2005 | Devos et al. | |
| 2005/0212717 A1 | 9/2005 | Baumstark | |
| 2006/0279493 A1 | 12/2006 | Syrstad | |
| 2008/0060234 A1* | 3/2008 | Chou ................... | G09F 9/33 40/452 |
| 2008/0266206 A1* | 10/2008 | Nelson ................. | G09F 9/33 345/1.3 |
| 2009/0009998 A1* | 1/2009 | Malstrom ............. | G09F 9/3026 362/249.01 |
| 2009/0266206 A1 | 10/2009 | Hsu | |
| 2014/0003050 A1 | 1/2014 | Hemiller et al. | |
| 2014/0003052 A1 | 1/2014 | Hemiller et al. | |
| 2014/0160363 A1 | 6/2014 | Mutschelknaus et al. | |
| 2017/0193864 A1 | 7/2017 | Hemiller et al. | |

FOREIGN PATENT DOCUMENTS

| | | |
|---|---|---|
| CN | 1595244 A | 3/2005 |
| CN | 101454524 A | 6/2009 |
| CN | 101515480 A | 8/2009 |
| CN | 101689337 A | 3/2010 |
| CN | 102402909 A | 4/2012 |
| CN | 102402910 A | 4/2012 |
| CN | 102402911 A | 4/2012 |
| CN | 202275567 U | 6/2012 |
| EP | 1515297 A1 | 3/2005 |
| EP | 1524640 A2 | 4/2005 |
| EP | 1580709 B1 | 9/2006 |
| EP | 2867882 B1 | 8/2016 |
| EP | 2867883 B1 | 8/2016 |
| JP | 2002366061 A | 12/2002 |
| WO | WO-2009152524 A2 | 12/2009 |
| WO | WO-2013060081 A1 | 5/2013 |
| WO | WO-2014004788 A1 | 1/2014 |
| WO | WO-2014004820 A1 | 1/2014 |

OTHER PUBLICATIONS

"U.S. Appl. No. 13/928,654, Advisory Action dated Aug. 7, 2015", 3 pgs.
"U.S. Appl. No. 13/928,654, Examiner interview Summary dated Jan. 30, 2015", 3 pgs.
"U.S. Appl. No. 13/928,654, Final Office Action dated May 7, 2015", 24 pgs.
"U.S. Appl. No. 13/928,654, Non Final Office Action dated Jun. 3, 2016", 25 pgs.
"U.S. Appl. No. 13/928,654, Non Final Office Action dated Oct. 24, 2014", 20 pgs.
"U.S. Appl. No. 13/928,654, Notice of Allowance Dec. 2, 2016", 8 pgs.
"U.S. Appl. No. 13/928,654, Preliminary Amendment filed Jul. 1, 2013", 7 pgs.
"U.S. Appl. No. 13/928,654, Response filed Jan. 26, 2015 to Non Final Office Action dated Oct. 24, 2014", 14 pgs.
"U.S. Appl. No. 13/928,654, Response filed Jul. 7, 2015 to Final Office Action May 7, 2015", 13 pgs.
"U.S. Appl. No. 13/928,654, Response filed Oct. 3, 2016 to Non Final Office Action dated Jun. 3, 2016", 15 pgs.
"U.S. Appl. No. 13/928,968, Advisory Action dated Jul. 19, 2016", 3 pgs.
"U.S. Appl. No. 13/928,968, Corrected Notice of Allowance dated Jan. 20, 2017", 2 pgs.
"U.S. Appl. No. 13/928,968, Corrected Notice of Allowance dated Feb. 10, 2017", 2 pgs.
"U.S. Appl. No. 13/928,968, Corrected Notice of Allowance dated Dec. 27, 2016", 2 pgs.
"U.S. Appl. No. 13/928,968, Final Office Action dated Mar. 31, 2016", 18 pgs.
"U.S. Appl. No. 13/928,968, Non Final Office Action dated Sep. 14, 2015", 18 pgs.
"U.S. Appl. No. 13/928,968, Notice of Allowance dated Nov. 16, 2016", 9 pgs.
"U.S. Appl. No. 13/928,968, Preliminary Amendment filed Jul. 1, 2013", 7 pgs.
"U.S. Appl. No. 13/928,968, Response filed Jan. 11, 2016 to Non Final Office Action dated Sep. 14, 2015", 29 pgs.
"U.S. Appl. No. 15/446,814, Non Final Office Action dated Jun. 16, 2017", 8 pgs.
"Australian Application Serial No. 2013280215, Office Action dated Nov. 11, 2016", 2 pgs.
"Australian Application Serial No. 2013280275, First Examiner Report dated Jun. 8, 2016", 3 pgs.
"Australian Application Serial No. 2013280275, Response filed Oct. 17, 2016 to First Examiner Report dated Jun. 8, 2016", 14 pgs.
"Australian Application Serial No. 2641117, Response filed Jan. 20, 2017 to First Examiner Report dated Nov. 11, 2016", 12 Pgs.
"Chinese Application Serial No. 201380044787.5, Office Action dated Mar. 15, 2017", w/English Claims, 7 pgs.
"Chinese Application Serial No. 201380044787.5, Office Action dated Jul. 20, 2016", w/English Translation, 22 pgs.
"Chinese Application Serial No. 201380044787.5, Response filed May 27, 2017 to Office Action dated Mar. 15, 2017", 9 pgs.
"Chinese Application Serial No. 201380044787.5, Response filed Dec. 5, 2016 to Office Action dated Jul. 20, 2016", W/ English Claims, 12 pgs.
"Chinese Application Serial No. 201380044798.3, Office Action Feb. 6, 2017", With English Translation, 16 pgs.
"Chinese Application Serial No. 201380044798.3, Office Action dated Jun. 2, 2016", With English Translation, 20 pgs.
"Chinese Application Serial No. 201380044798.3, Response filed Apr. 21, 2017 to Office Action dated Feb. 6, 2017", w/ English Claims, 12 pgs.
"Chinese Application Serial No. 201380044798.3, Response filed Oct. 17, 2016 to Office Action dated Jun. 2, 2016", w/ English Claims, 13 pgs.
"European Application Serial No. 13734940.3, Communication under Rule 71(3) dated Jan. 7, 2016", 66 pgs.
"European Application Serial No. 13734940.3, Office Action dated Mar. 25, 2015", 2 pgs.
"European Application Serial No. 13734940.3, Response filed Sep. 16, 2015 to Office Action dated Mar. 25, 2015", 69 pgs.
"European Application Serial No. 13737917.8, Communication under Rule 71(3) dated Jan. 12, 2016", 79 pgs.
"European Application Serial No. 13737917.8, Office Action dated Mar. 25, 2015", 2 pgs.
"European Application Serial No. 13737917.8, Response filed Sep. 25, 2015 to Office Action dated Mar. 25, 2015", 23 pgs.
"European Application Serial No. 16182273.9, Extended European Search Report dated Nov. 7, 2016", 8 pgs.

(56) References Cited

OTHER PUBLICATIONS

"International Application Serial No. PCT/US2013/048121, International Preliminary Report on Patentability dated Jan. 8, 2015", 7 pgs.
"International Application Serial No. PCT/US2013/048121, International Search Report dated Sep. 26, 2013", 6 pgs.
"International Application Serial No. PCT/US2013/048121, Written Opinion dated Sep. 26, 2013", 6 pgs.
"International Application Serial No. PCT/US2013/048167, International Preliminary Report on Patentability dated Jan. 8, 2015", 6 pgs.
"International Application Serial No. PCT/US2013/048167, International Search Report dated Sep. 30, 2013", 6 pgs.
"International Application Serial No. PCT/US2013/048167, Written Opinion dated Sep. 30, 2013" 4 pgs.
Mutschelknaus, Shannon Lee, et al., "Encapsulation of Light-Emitting Elements on a Display Module", U.S. Appl. No. 61/735,346, filed Dec. 10, 2012, 32 pgs.

\* cited by examiner

DISPLAY MODULE MOUNTING

CLAIM OF PRIORITY

This application is a continuation of and claims the benefit of priority to U.S. application Ser. No. 13/928,968, entitled "DISPLAY MODULE MOUNTING," which claims the benefit of priority to U.S. Provisional Patent Application Ser. No. 61/665,579, entitled "DISPLAY MODULE MOUNTING," filed on Jun. 28, 2012, and the benefit of priority to U.S. Provisional Application Ser. No. 61/754,043, entitled "DISPLAY MODULE MOUNTING," filed Jan. 18, 2013, the disclosures of each of which are hereby incorporated by reference herein in their entirety.

BACKGROUND

Some examples of light-emitting diode (LED) display modules incorporate an arrangement of different colored LEDs, such as red-green-blue LED pixel packages. The LED pixel packages or other LED arrangements can be coupled to, and extend from, a circuit board. The circuit board, with the coupled LEDs, can be mounted to a frame to form an LED module. A plurality of LED modules can be mounted to a cabinet or support chassis in close proximity to form a larger LED display such that when the plurality of LED modules are operated together, the resulting LED display appears to be a single, continuous display.

SUMMARY

This patent document discloses, among things, a video display module, such as an LED module, and a video display formed from a plurality of modules where each individual video display module can be easily mounted onto, or dismounted from, a support chassis by an installer user without the video display contacting or otherwise interfering with one or more adjacently-positioned video display modules mounted to the support chassis. This patent document also discloses a video display module including one or more primary securing structures, such as magnets, latches, or fasteners, and a security latch that can provide protection against unintentional dislodging of the video display module, such as due to high winds or accidental dislodging.

This patent document describes a frame for a video display module. The frame can include a first face configured for coupling with a light-emitting element circuit board, a second face configured for mounting to a support chassis, and one or more first securing structures coupled to the second face, the one or more first securing structures being configured to mount or secure the frame to the support chassis. The frame can also include one or more security latches each comprising a latch body movable between a latched position and an unlatched position. The latch body can be configured to engage a first feature of the support chassis to prevent removal of the video display module when in the latched position.

This patent document also describes a video display module, including a circuit board including a plurality of light emitting elements, a frame having a first face coupled with the circuit board and a second face configured for mounting to a support chassis, and one or more first securing structures coupled to the second face. The one or more first securing structures can be configured to mount or secure the frame to the support chassis. The video display module can also include one or more security latches each comprising a latch body movable between a latched position and an unlatched position. Each latch body can be configured to engage a feature of the support chassis to prevent removal of the video display module when the latch body is in the latched position.

This patent document also describes a video display system including a support chassis and one or more video display modules. Each of the one or more video display modules can include a circuit board including a plurality of light emitting elements, a frame having a first face coupled with the circuit board, and a second face configured for mounting to the support chassis. Each video display module can also include one or more first securing structures coupled to the second face, the one or more first securing structures being configured to mount or secure the video display module to the support chassis. Each video display module can also include one or more security latches each comprising a latch body movable between a latched position and an unlatched position. Each latch body can be configured to engage a feature of the support chassis to prevent removal of the video display module when the latch body is in the latched position.

These and other examples and features of the present display module mounting configurations and related methods will be set forth, in part, in the following Detailed Description. This Summary is intended to provide an overview of subject matter of the present disclosure—it is not intended to provide an exclusive or exhaustive explanation. The Detailed Description below is included to provide further information about the present disclosure.

BRIEF DESCRIPTION OF THE DRAWINGS

In the drawings, like numerals can be used to describe similar elements throughout the several views. Like numerals having different letter suffixes can be used to represent different views of similar elements. The drawings illustrate generally, by way of example, but not by way of limitation, various examples discussed in the present document.

DETAILED DESCRIPTION

In the following Detailed Description, reference is made to the accompanying drawings which form a part hereof. The drawings show, by way of illustration, specific examples in which the present display module mounting configurations and related methods can be practiced. These examples are described in sufficient detail to enable those skilled in the art to practice, and it is to be understood that other embodiments can be utilized and that structural changes can be made without departing from the scope of the present disclosure. Therefore, the following Detailed Description is not to be taken in a limiting sense, and the scope of the present disclosure is defined by the appended claims and their equivalents.

Figure 1:
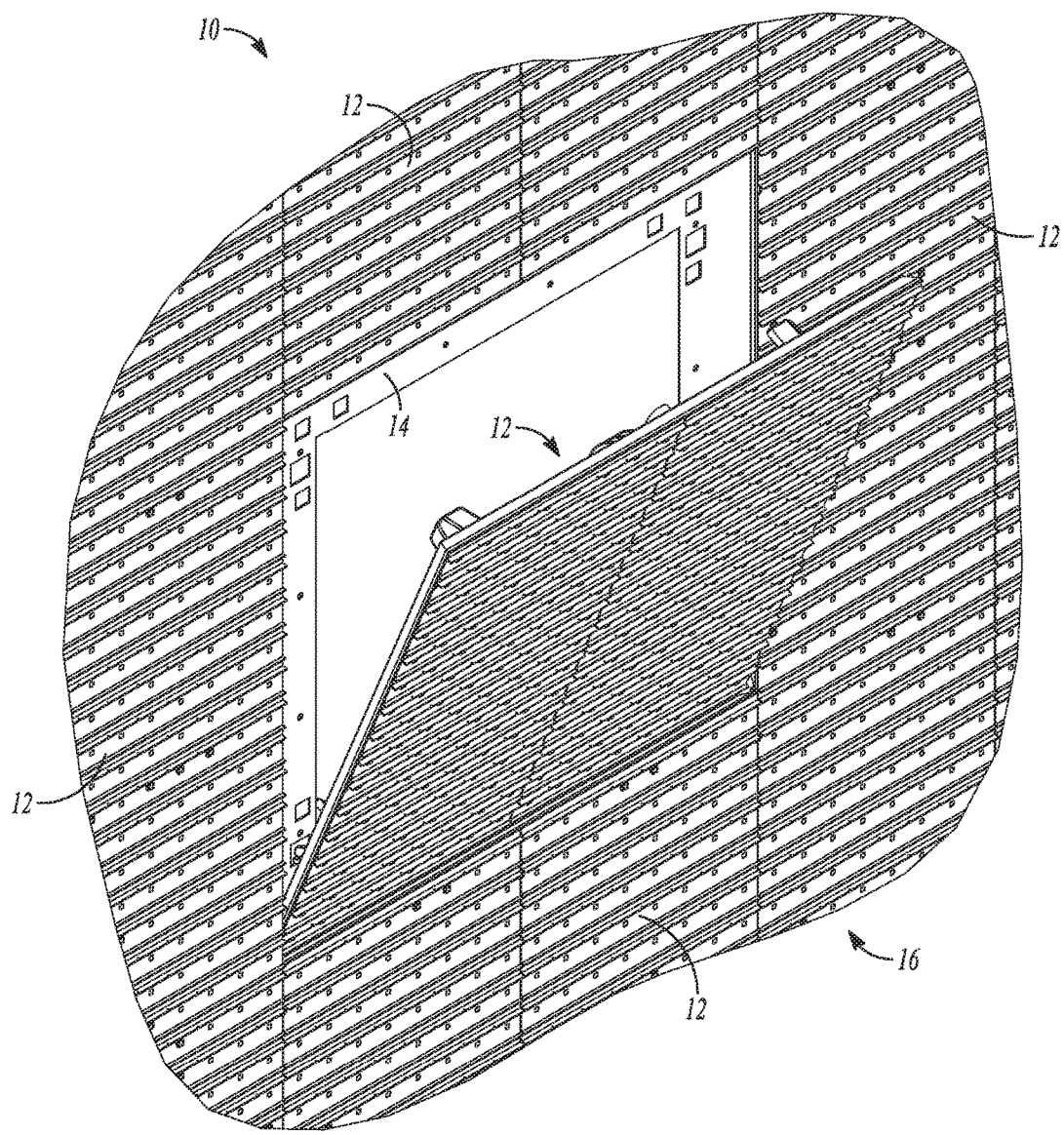
FIG. 1 is a front perspective view of an example LED display with an example LED module being installed or uninstalled from the display.
Figure 2:
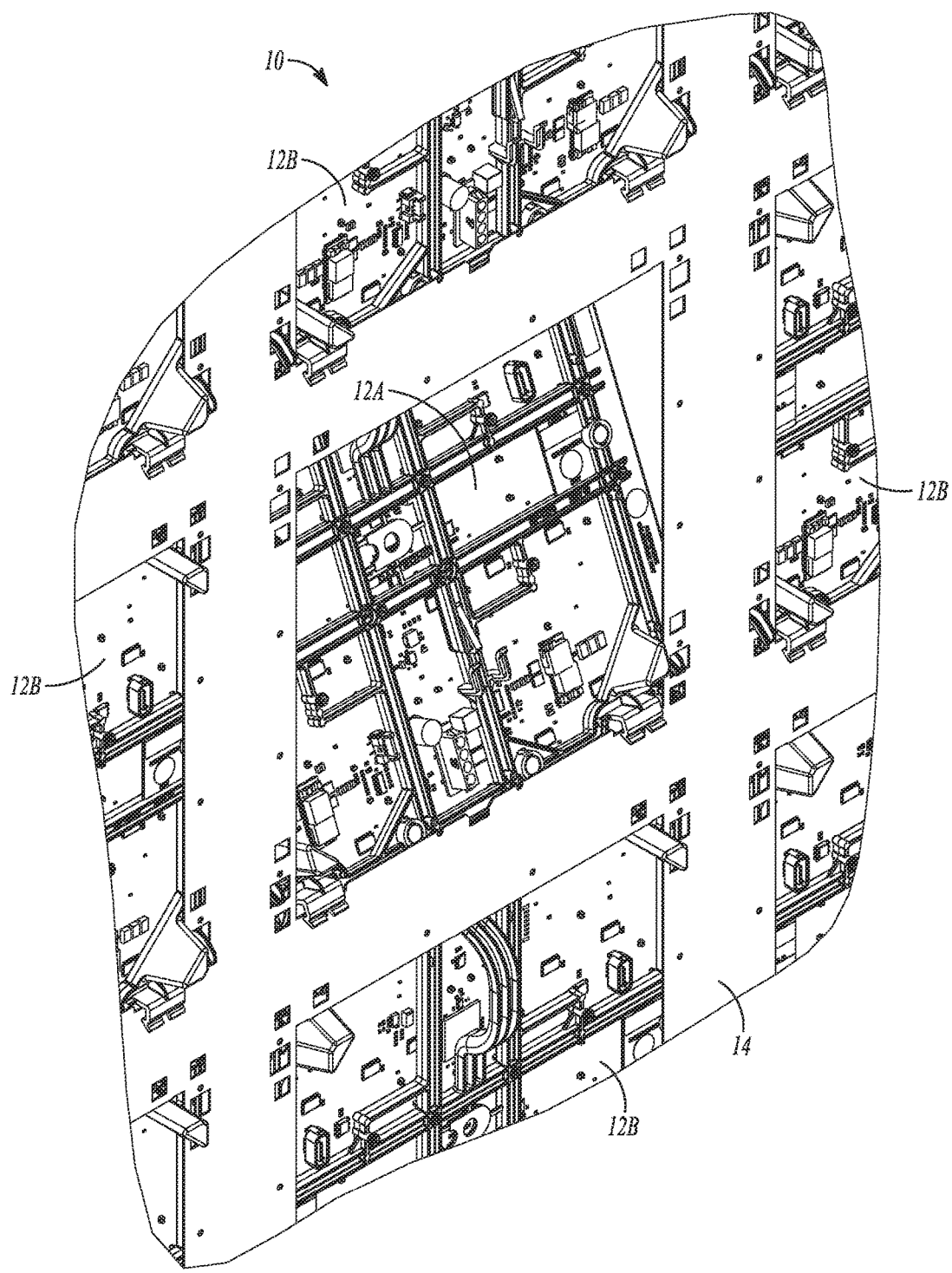
FIG. 2 is a back perspective view of an example LED display with an example LED module being installed or uninstalled from the display.

FIGS. 1 and 2 show a portion of an example video display 10. The video display 10 can include a plurality of individual video display modules 12 mounted to a support chassis 14. The plurality of video display modules 12 can be operated together so that the overall video display 10 appears as a single, larger display. The video display modules 12 can include a plurality of light-emitting elements to produce image or video data on the video display 10. Examples of light-emitting elements that can be used with the modules 12 include, but are not limited to, light-emitting diodes (LEDs), organic light-emitting diodes (OLEDs), organic light-emitting transistors (OLETs), surface-conduction electron-emitter display devices (SEDs), field-emission display devices (FEDs), laser TV quantum dot liquid crystal display devices, quantum dot display devices (QD-LED), ferro-liquid display devices (FLDs), liquid crystal display devices (LCDs), and thick-film dielectric electroluminescent devices (TDELs). Currently, the most commercially viable type of video display for large-scale displays is a display using light-emitting diodes (LEDs) as the light-emitting elements, referred to as an LED display. Therefore, for the sake of brevity, this disclosure can refer to the video display 10 as an "LED display 10." the video display module 12 as an "LED module 12," and the light-emitting elements as LEDs. The present disclosure is not so limited, however, and a person of ordinary skill in the art will understand that other types of video display technologies can be used. Another, non-limiting example of a video display module that can be used with the concepts of the present disclosure is described in U.S. Provisional Patent Application No. 61/735,346 "ENCAPSULATION OF LIGHT-EMITTING ELEMENTS ON A DISPLAY MODULE," filed on Dec. 10, 2012, which is incorporated by reference as if reproduced herein in its entirety. This and all other referenced patents and applications are incorporated herein by reference in their entirety.

The LED display 10 can include a front LED display surface 16 configured to provide for a display of graphics or video content. The front LED display surface 16 can be formed from a plurality of individual light-emitting elements, such as LEDs. When multiple light-emitting elements are positioned together in close proximity, various colors can be shown by combining the colors of more than one light emitting element. In an example, the front LED display surface 16 can include an array of LED pixels that each includes a red, a green, and a blue LED. The red, green, and blue LEDs can cooperate to provide a spectrum of colors when one, two, or three of the light emitting elements in a pixel are lit at varying intensities. The front LED display surface 16 can also provide a black or empty looking surface over a portion of the display, when desired, by deactivating or turning off the LEDs in a particular portion of the LED display surface 16.

FIG. 1 shows a front perspective view of the LED display 10 with one of the LED modules 12 being in a tilted position relative to the support chassis 14, which can occur when the LED module 12 is in the process of being mounted to, or dismounted from, the support chassis 14. FIG. 2 shows a rear perspective view of the LED display 10, where a first LED module 12A is tilted relative to the support chassis 14, while adjacently-positioned second LED modules 12B are mounted to the support chassis 14. As described in more detail below, the first LED module 12A can include one or more structures that allow the first LED module 12A to be mounted to, or dismounted from, the support chassis 14 without contacting or otherwise interfering with the one or more installed, adjacently-positioned second LED modules 12B.

Figure 3:
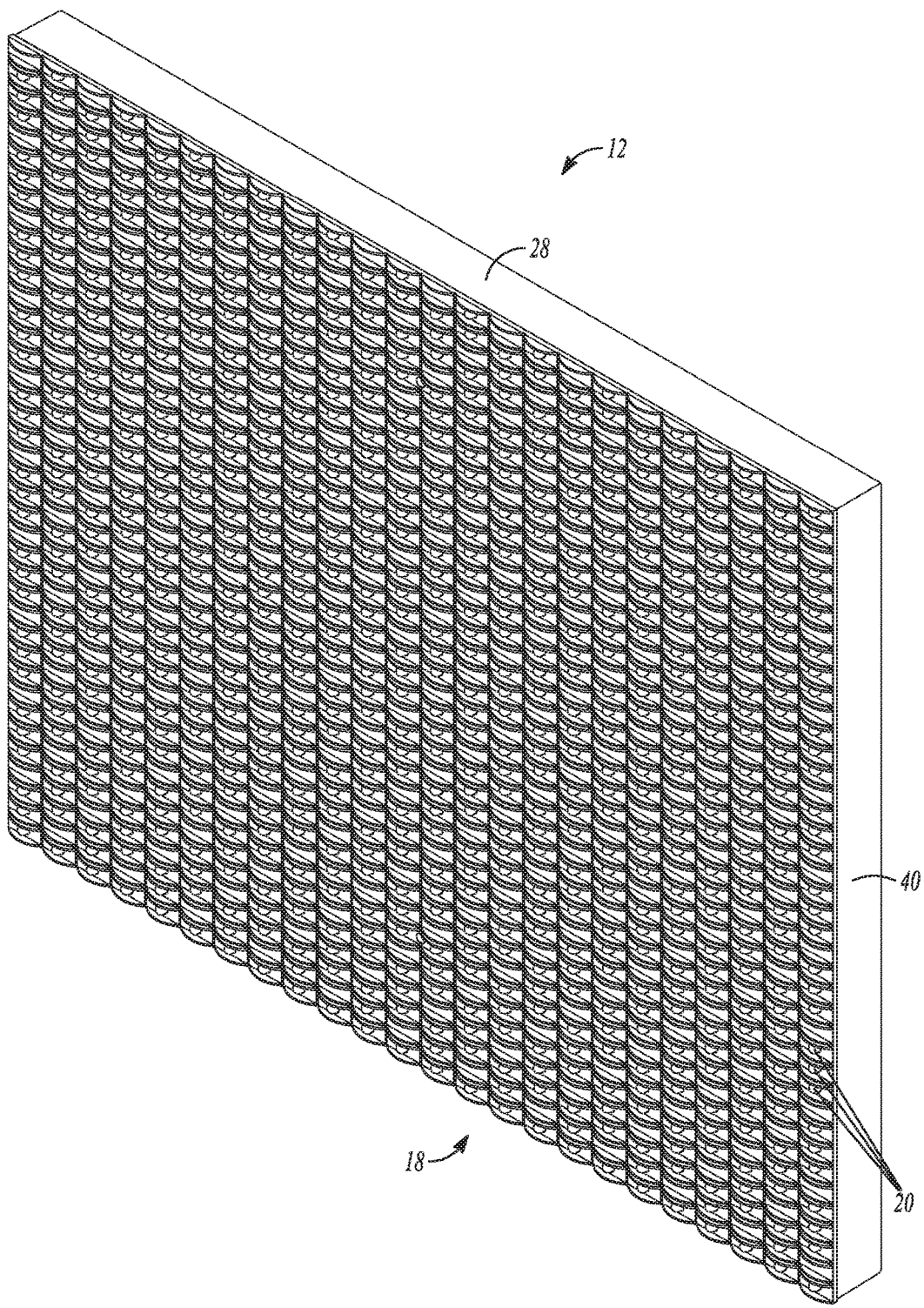
FIG. 3 is a perspective view of an example LED module.

FIG. 3 is a perspective view of a non-limiting example LED module 12, such as the first LED module 12A of FIG. 2. The LED module 12 can include a front LED display surface 18 configured to provide for a display of graphics or video content. The LED display surface 18 can include a plurality of individual light-emitting elements, such as LEDs 20. The front LED display surface 18 of the LED module 12 can be combined with front LED display surfaces 18 of one or more adjacently-positioned LED modules 12, such as the second LED modules 12B of FIG. 2, to form the front LED display surface 16 of the larger LED display 10.

Figure 4A:
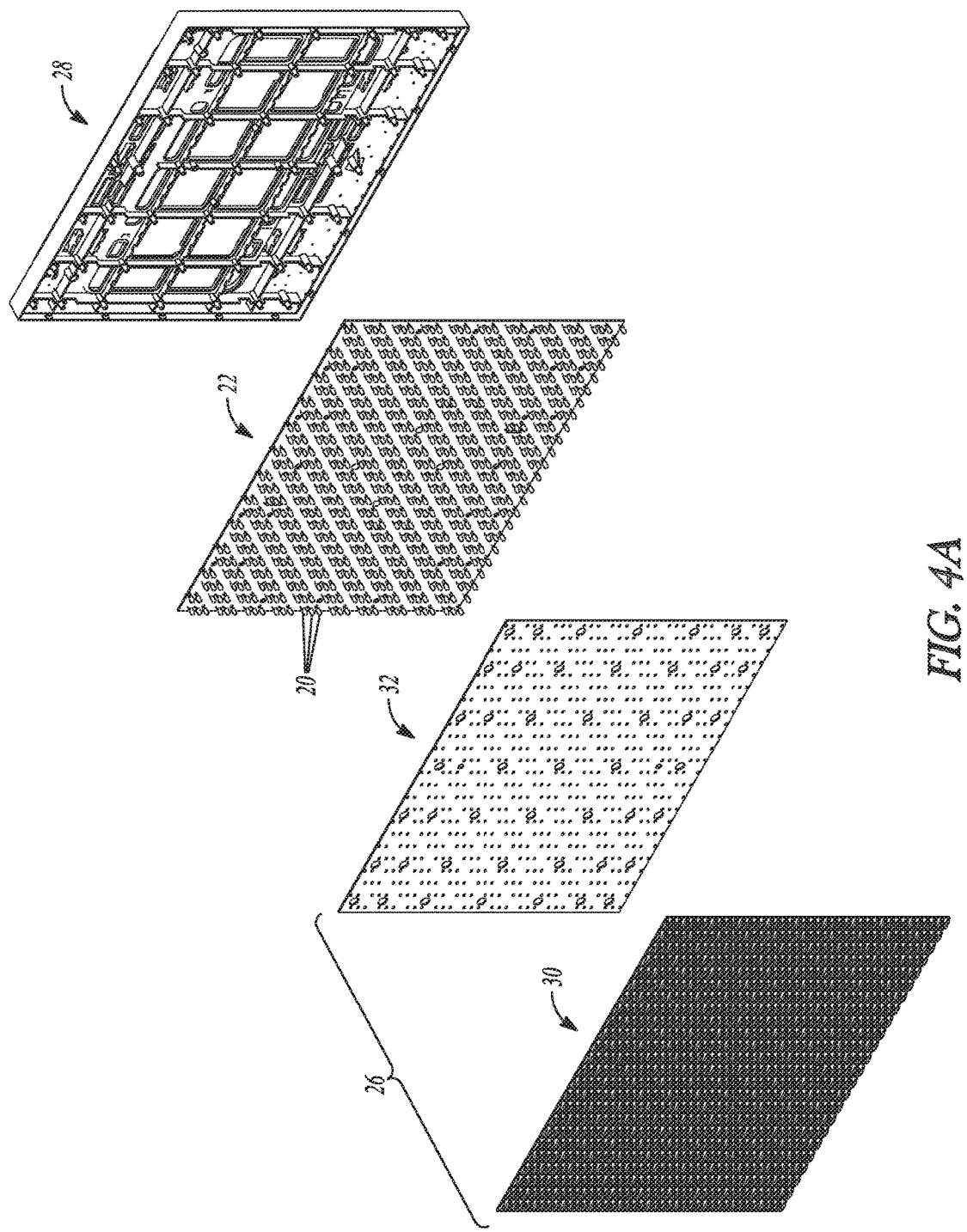
FIG. 4A is an exploded side view of an example LED display module.
Figure 4B:
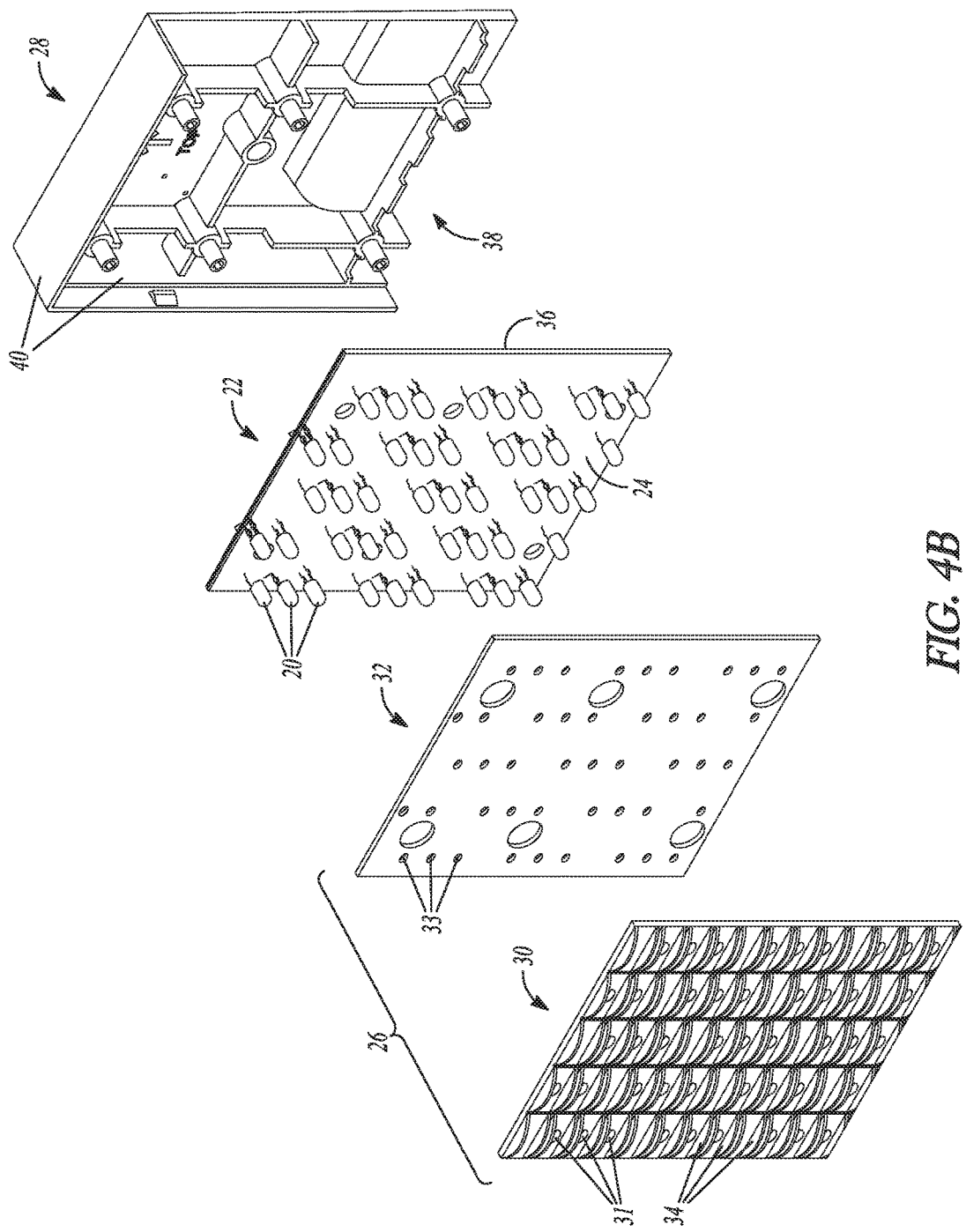
FIG. 4B is an exploded perspective view of the example LED display module of FIG. 4A.

FIGS. 4A and 4B show exploded perspective views of an example LED module 12. The LED module 12 can include a circuit board 22 and a plurality of LEDs 20. The plurality of LEDs 20 can be mounted and electrically coupled to a front face 24 of the circuit board 22. An LED mask 26 can be coupled over the top of the LEDs 20 and the front face 24 of the circuit board 22. The circuit board 22 can be coupled with a frame 28. The LED module 12 can be configured for use in an exterior environment, such as in an outdoor stadium or arena, or in an interior environment, such as an indoor stadium, arena, or venue.

FIGS. 4A and 4B show a non-limiting example of an LED mask 26. The LED mask 26 can enclose a front face of the LED module 12 and can seal an exterior environment of the LED module 12 from an interior of the LED module 12, such as the circuit board 22 and the LEDs 20. The LED mask 26 can be formed from a plurality of components, such as a substrate 30 and a pliable seal membrane 32. In an example, prior to assembly, the pliable seal membrane 32 is coupled with the substrate 30. For instance, the pliable seal membrane 36 can be over-molded onto the substrate 30, thereby making the LED mask 26 a unitary structure. The LED mask 26 can include a plurality of lumens sized and shaped to receive the plurality of LEDs 20 in a specified pattern and posture on the circuit board 22. In an example, the lumens of the LED mask 26 can include a plurality of lumens 31 through the substrate 30 and a plurality of corresponding lumens 33 through the pliable seal membrane 32. In an example, each substrate lumen 31 can be registered with a corresponding membrane lumen 33 and the resulting passageway can receive a corresponding one of the LEDs 20. The substrate 30, the pliable seal membrane 32, or both, can tightly engage around each of the LEDs 20 and can allow the LEDs 20 to project through the LED mask 26 in a sealed manner to prevent or reduce exposure of the interior of the LED module 12 to the exterior environment.

The substrate 30 can optionally include louver blades 34. The louver blades 34 can extend at least partially over or under the one or more of the LEDs 20 projecting through the LED mask 26. Each louver blade 34 can provide a measure of shade to one or more corresponding LEDs 20 and can thus assist in preventing interaction of the LED 20 with sunlight. For instance, glare, such as sunlight glare off of the LEDs 20, can interfere with projection of a true color from the LED modules 12. Accurate representation of graphic and video content can be frustrated by this interference. The shade provided by the louver blades 34 can assist in preventing glare from the LEDs 20 and additionally can allow the LEDs 20 to present a true color or a near true color from a shaded field with minimized interaction with ambient light. Further, the louver blades 34 can provide shadow in an area of the front LED display surface 18. When it is desired that a portion of the front LED display surface 18 be dark or present a black surface when video or graphic content is displayed, the shade provided by the louver blades 34 can assist so that the unlit portion of the LED display surface 18 can appear black. If glare, such as sunshine glare, is not expected to be an issue, such as when the LED module 12 is configured for use in an interior environment, then the louver blades 34 can be omitted.

An example of an LED module, including an LED mask, is disclosed in Nathan L. Nearman, U.S. patent application Ser. No. 12/859,833, entitled "LIGHT ELEMENT SEAL MODULE AND METHOD FOR SAME," filed on Aug. 20, 2010, and in Nathan L. Nearman, U.S. Provisional Patent Application Ser. No. 61/236,738, entitled "LIGHT ELEMENT SEAL MODULE AND METHOD FOR SAME," filed on Aug. 25, 2009, both of which are herein incorporated by reference in their entirety.

A rear face 36 of the circuit board 22 can be coupled with a front face 38 of the frame 28. The frame 28 can also provide for a perimeter seal around the circuit board 22 so that, in conjunction with the LED mask 26, an interior of the LED module 12 can be isolated from the exterior environment. The perimeter seal can be formed between an edge seal 40 that can extend from the front face 38 of the frame 28 and can surround the circuit board 22. The edge seal 40 can seal against at least one of an edge of the circuit board 22 or the LED mask 26, such as by sealing against the substrate 30 or the pliable seal membrane 32.

Figure 5:
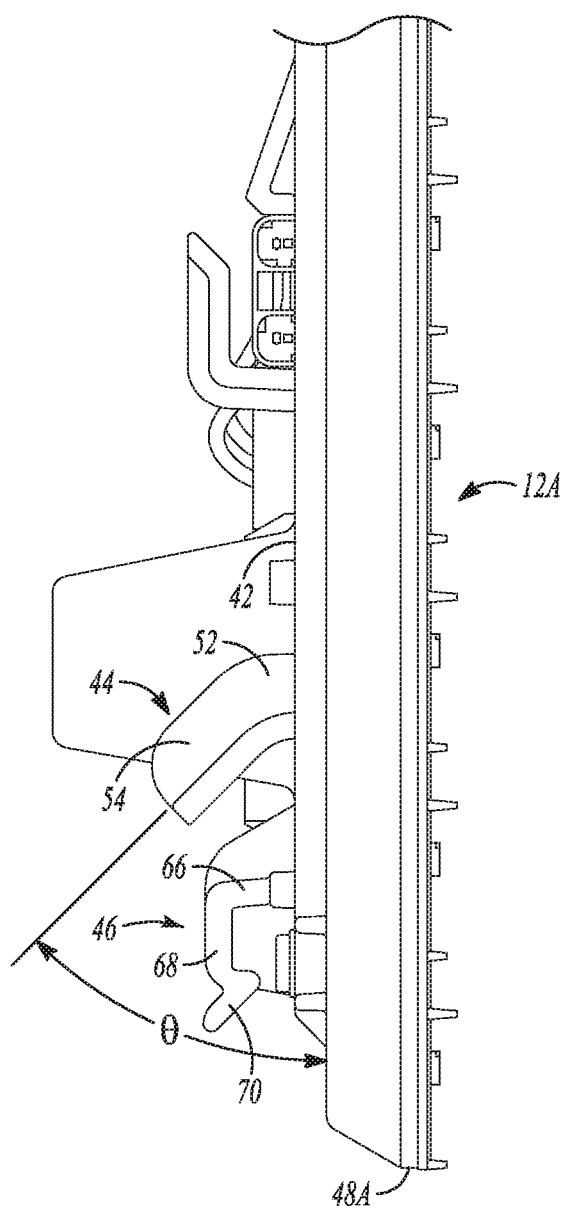
FIG. 5 is a side view of an example LED module.
Figure 6:
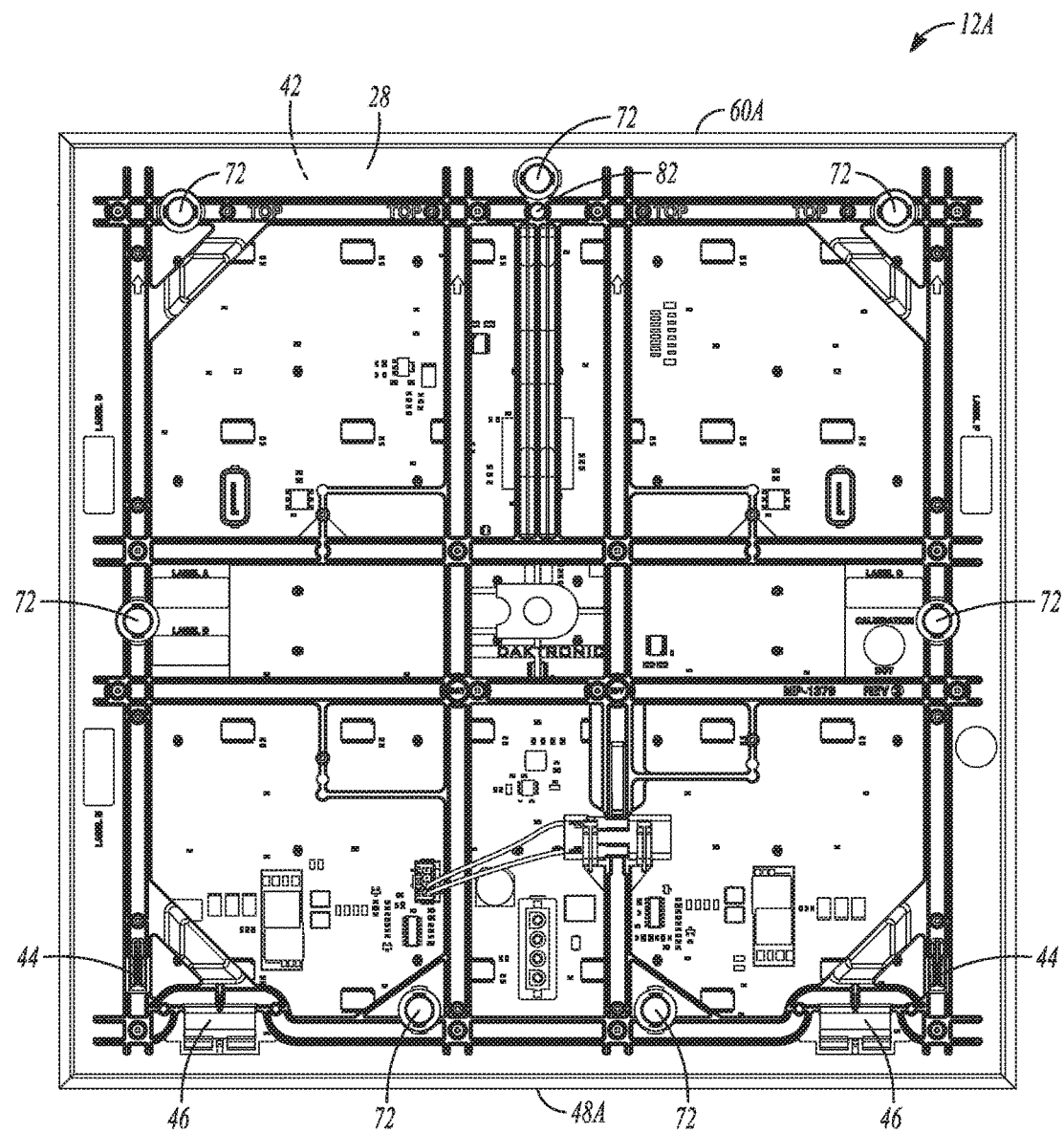
FIG. 6 is a rear view of an example LED module.

The frame 28 can provide a structure for mounting the circuit board 22 and the LED mask 26 to the support chassis 14. In an example, a rear face 42 (FIG. 5) of the frame 28 can be configured for mounting to the support chassis 14. The frame 28 can include one or more features or structures that can provide for simplified installation of the LED module 12 and avoid contacting or interfering with an adjacently-positioned LED module during installing or uninstallation of the LED module 12. FIGS. 5 and 6 show an example of an LED module 12 with these features.

FIG. 5 shows a side view of a portion of the LED module 12. The frame 28 of the LED module 12 can include one or more translating structures 44 that are configured to engage a feature of the support chassis 14 and effectuate a translation of the LED module 12. The translation of the LED module 12 can avoid contact or interference with an adjacently-positioned LED module, mounted to the support chassis 14, during a procedure for mounting the LED module 12 to the support chassis 14, or during a procedure for dismounting the LED module 12 from the support chassis 14. The frame 28 can also include one or more securing structures configured for mounting or securing the LED module 12 to the support chassis 14. In an example, the one or more securing structures can include one or more mounting hooks 46 configured for engaging a feature of the support chassis 14. In the example of FIG. 5, the one or more translating structures 44 and the one or more securing structures, such as the one or more mounting hooks 46, can be located proximate to a bottom edge 48A of the LED module 12. However, the translating structures 44, the securing structures, or both, can be located anywhere on the LED module 12 where they can provide for mounting of the LED module 12 to the support chassis 14 and for effectuating a translation of the LED module 12. In varying examples, the one or more translating structures 44 and the one or more mounting hooks 46 are located proximate the same edge of the LED module 12A, such as both being located proximate the bottom edge 48A.

Figure 8A:
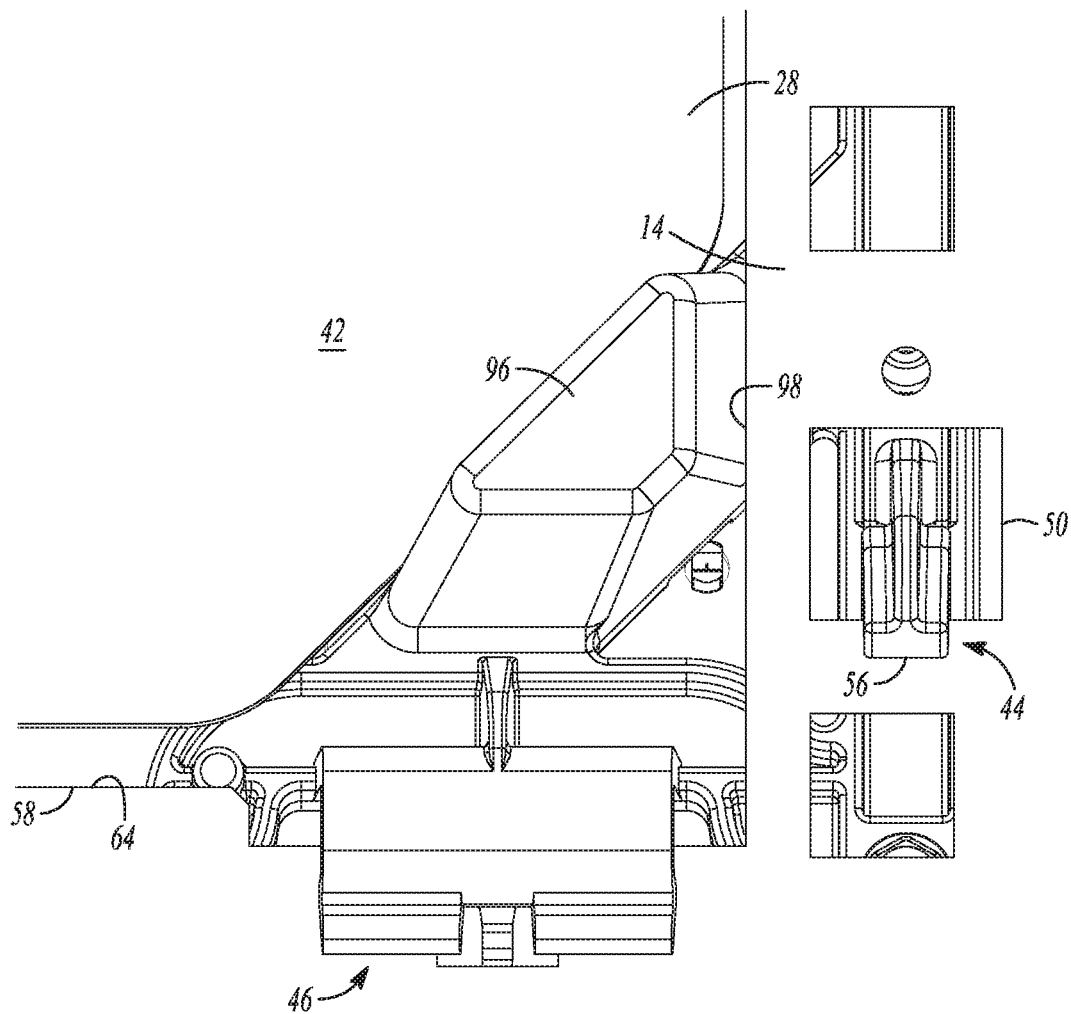
FIG. 8A is a rear view of a portion of an example LED module in a first position as the example LED module is being mounted to, or dismounted from, a support chassis.
Figure 8B:
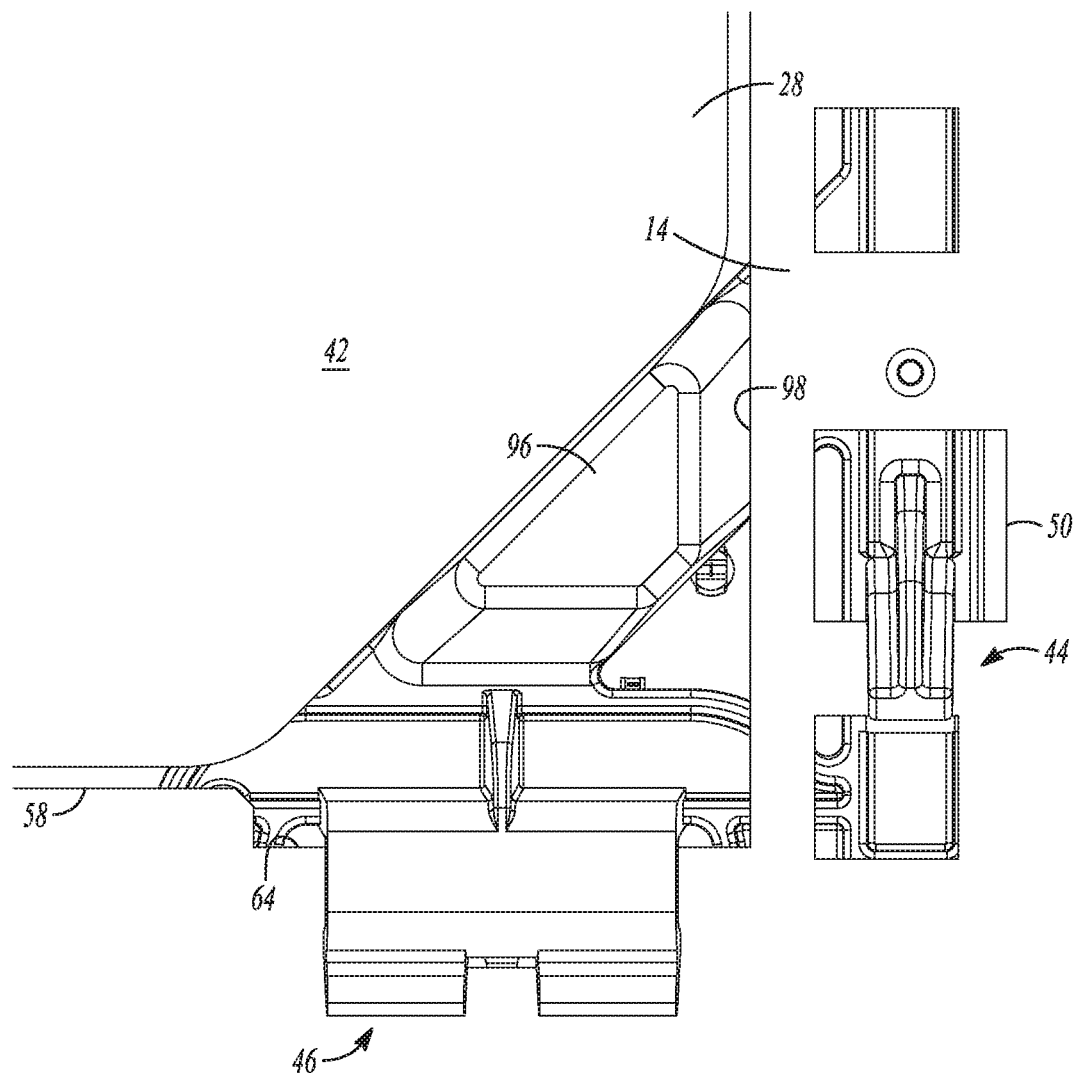
FIG. 8B is a rear view of a portion of the example LED module of FIG. 8A in a second position as the example LED module is being mounted to the support chassis.

The one or more translating structures 44 can each extend from the rear face 42 of the frame 28 and can each engage a corresponding feature of the support chassis 14, such as a corresponding opening 50 (shown in FIGS. 8A and 8B). The engagement between each translating structure 44 and the support chassis feature can provide for controlled movement of the LED module 12 as it is being mounted or dismounted. Each translating structure 44 can extend rearward and downward from the rear face 42 of the frame 28. The translating structures 44 can include one or more straight portions, one or more curved portions, or both, but the overall configuration of each translating structure 44 can be directed downward and rearward in order to effectuate a translation of the LED module 12. In an example, each translating structure 44 can extend rearward and downward with at least a portion of the translating structure 44 being at an acute angle with respect to the rear face 42. In the example shown in FIG. 5, the translating structure 44 can include a first portion 52 that extends generally rearwardly from the rear face 42 of the frame 28 and a second portion 54 that is angled rearward and downward from the first portion 52.

The second portion 54 can be oriented at an acute angle $\theta$ with respect to the rear face 42 of the frame 28. The angle $\theta$ between the second portion 54 and the rear face 42 of the frame 28 can be selected to provide for a desired translation of the LED module 12 relative to the support chassis 14, relative to an adjacently-positioned LED module, or both.

Figure 7A:
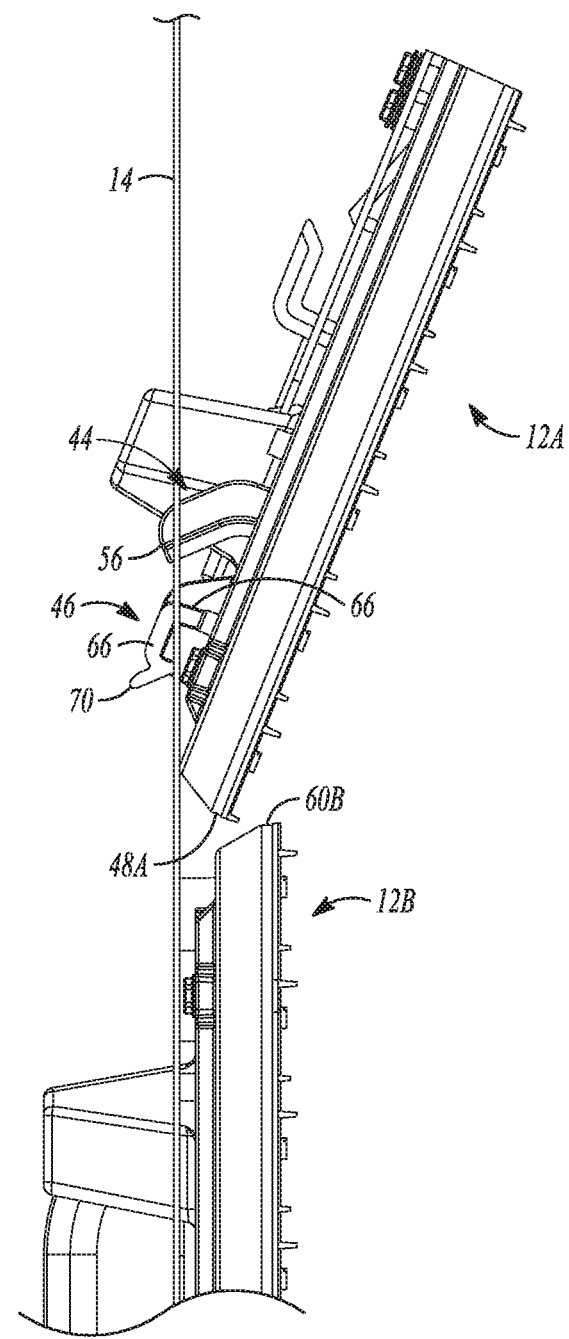
FIG. 7A is side view of an example LED module in a first position as the LED module is being mounted to, or dismounted from, a support chassis.
Figure 7B:
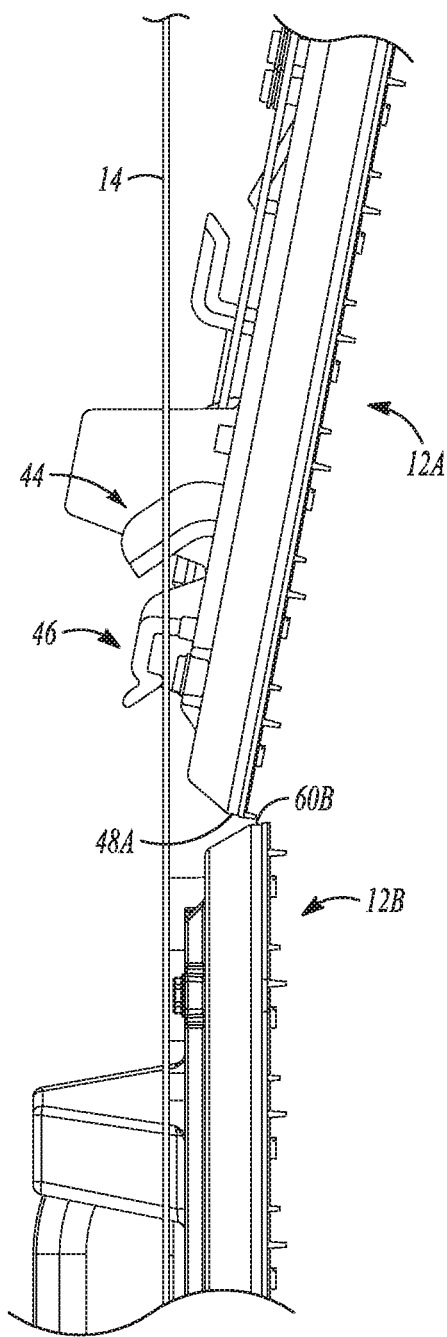
FIG. 7B is a side view of the example LED module of FIG. 7A as the LED module is being transitioned from the first position to a second position as the LED module is being mounted to the support chassis, or as the LED module is being transitioned from the second position to the first position as the LED module is being dismounted from the support chassis.
Figure 7C:
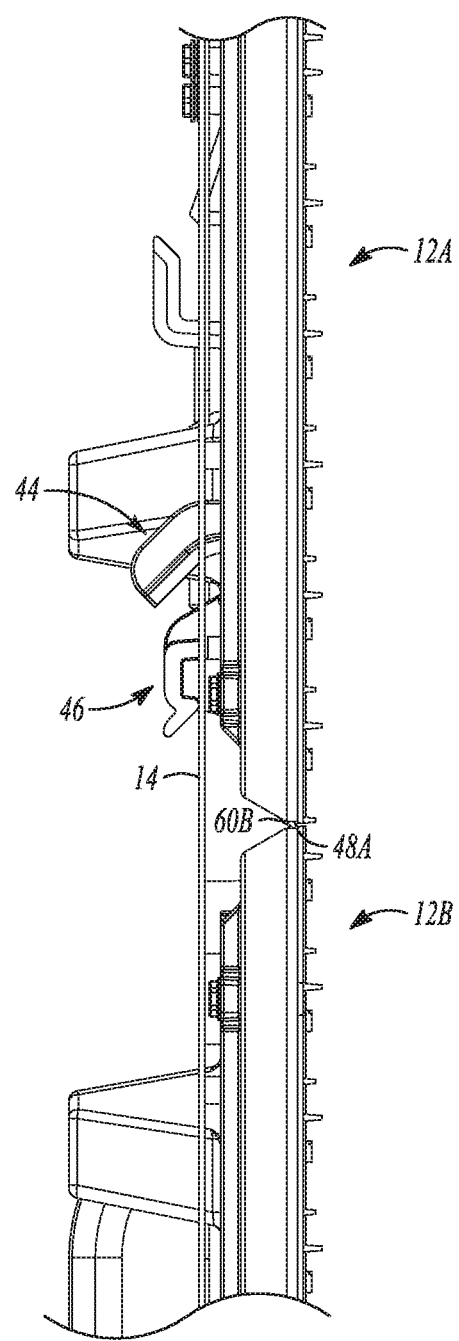
FIG. 7C is a side view of the example LED module of FIG. 7A and FIG. 7B in the second position as the LED module is being mounted to the support chassis.

FIGS. 7A-7C and FIGS. 8A and 8B show an example of the translating motion of a first LED module 12A, relative to the support chassis 14 and relative to an adjacently-positioned LED module, such as a second LED module 12B, as the first LED module 12A is being mounted to, or dismounted from, the support chassis 14. In particular, FIGS. 7A-7C show the motion of the first LED module 12A between a first position, also referred to herein as a tilted position (FIG. 7A), and a second position, also referred to herein as an aligned position (FIG. 7C), or vice versa, with FIG. 7B representing an intermediate position between the tilted position and the aligned position. In an example, in the tilted position, the first LED module 12A can be tilted relative to the support chassis 14, relative to adjacently-positioned LED modules, such as the second LED module 12B, or both. In the aligned position, the first LED module 12A can be aligned, such as by being parallel or substantially parallel to, the support chassis 14, and can be aligned with adjacently-positioned LED modules, such as by parallel or substantially parallel to the second LED module 12B. The alignment of the first LED module 12A and adjacently-positioned LED modules can provide for a substantially uniform front LED display surface 16 of an LED display 10 that appears to the viewer to be a large, continuous display surface.

In an example process of mounting the first LED module 12A onto the support chassis 14, while the first LED module 12A is in the tilted position relative to the support chassis 14, each of the one or more translating structures 44 can be engaged with a corresponding feature of the support chassis 14, such as an opening 50 (FIGS. 8A and 8B). In an example, an end 56 of each translating structure 44 can be inserted into the opening 50 (FIGS. 7A and 8A). While in the tilted position, the first LED module 12A can also be positioned so that one or more other structures or features of the first LED module 12A are aligned with corresponding features of the support chassis 14. For example, each of one or more securing structures, such as each of one or more mounting hooks 46, can be engaged with an opening within the support chassis 14, such as a mounting opening 58 in which the first LED module 12A is to be mounted. The one or more translating structures 44 can be configured to bear some or the entire load of the first LED module 12A while in the first position or the second position. The one or more mounting hooks 46 can also be configured to bear some or the entire load of the first LED module 12A while the translating structure 44 is being positioned or moved between the first position and the second position and after the first LED module 12A has been mounted to the support chassis 14. In an example, the translating structures 44 and the mounting hooks 46 can share the weight of the LED module 12A.

After positioning the translating structures 44 while in the tilted position, the first LED module 12A can be rotated or pivoted relative to the support chassis 14 to move the first LED module 12A to the aligned position by aligning the first LED module 12A relative to the support chassis 14, relative to the second LED module 12B, or both. In the example shown in FIGS. 7A-7C, a bottom edge 48A of the first LED module 12A can be rotated away from the support chassis 14 while a top edge 60A of the first LED module 12A can be rotated toward the support chassis 14. As shown in FIGS. 7B and 7C, as the bottom edge 48A rotates away from the support chassis 14, it can be rotating toward a top edge 60B of an adjacently-positioned second LED module 12B mounted to the support chassis 14 below the first LED module 12A. Similarly, the top edge 60A of the first LED module 12A can be rotating toward a bottom edge of an adjacently-positioned LED module mounted to the support chassis 14 above the first LED module 12A.

The one or more translating structures 44 can be configured so that as the first LED module 12A moves from the tilted position to the aligned position, or vice versa, the first LED module 12A is translated away from contact or interference with the adjacently-positioned second LED module 12B. In the example shown in FIGS. 7A-7C, the one or more translating structures 44 can cause the bottom edge 48A of the first LED module 12A to be translated upward, e.g., lifted, relative to the support chassis 14 as the first LED module 12A moves from the tilted position (FIG. 7A) to the aligned position (FIG. 7C) so that the bottom edge 48A does not contact the top edge 60B of the second LED module 12B. The one or more translating structures 44 can also cause a top edge of the first LED module 12A to be translated downward, e.g., dropped, relative to the support chassis 14 and an adjacent LED module as the LED module 12A moves from the tiled position to the aligned position. In an example, as the first LED module 12A is rotated relative to the support chassis 14, the angled second portion 54 of each translating structure 44 can slide along an edge 62 of the opening 50 in the support chassis 14. The angle θ between the angled second portion 54 and the rear face 42 of the frame 28 can allow the first LED module 12A to be translated as it is rotated so that the bottom edge 48A is lifted and the top edge 60A is dropped.

The acute angle θ can be selected so that the LED module 12A will be translated sufficiently to avoid contact or interference with the second LED module 12B. In an example, the smaller the angle θ, e.g., the more acute the angle θ is, the larger the upward translation of the LED module 12A will be. However, the smaller the acute angle θ, the more the translating structure 44 can tend to bind or clamp against the support chassis 14 rather than translating the LED module 12A. In an example, the acute angle θ can be selected so that the first module 12A is lifted enough that it avoids contact or interference with the second LED module 12B, but not so much that any securing structures, such as the mounting hooks 46 (described below) become disengaged from the support chassis 14. In an example, the one or more translating structures 44 and the one or more securing structures, such as the one or more mounting hooks 46, are configured so that when the first LED module 12A is in the tilted position; both the translating structures 44 and the mounting hooks 46 engage their respective features of the support chassis 14. The engagement of the translating structures 44 and the mounting hooks 46 with the respective features of the support chassis 14 can allow the LED module 12A to be repaired or otherwise maintained while still being supported by the support chassis 14.

The value of the angle θ between the angled second portion 54 of the translating structure 44 and the rear face 42 of the frame 28 can depend on other physical dimensions of the LED module 12A being mounted, the physical dimensions of adjacently-positioned LED modules, such as the second LED module 12B, and the physical dimensions of the support chassis 14. For example, the thickness of the support chassis 14 can affect the angle θ value that can be useful for the first LED module 12A. The location of the translating structure 44 relative to the adjacently-positioned LED modules, such as the distance between the translating structure 44 and the second LED module 12B, the position of the translating structure 44 with respect to the second LED module 12B, or an orientation of the translating structure 44 with respect to the second LED module 12B can also affect the angle θ value. In an example, the acute angle θ can be between about 30 degrees and about 60 degrees, inclusive, for example about 45 degrees.

The use of the translating structure 44 with the first LED module 12A can provide for easy mounting or dismounting of the first LED module 12A to the support chassis 14, without the first LED module 12A contacting or interfering with adjacently-positioned LED modules during mounting or dismounting. For example, the translating structure 44 can allow the first LED module 12A to be tilted with respect to the support chassis 14 at the beginning of installation, which can allow for easier manipulation of the first LED module 12A while moving the first LED module 12A into position for mounting. The translating structure 44 can then allow the first LED module 12A to rotate relative to the support chassis 14 and can effectuate translation of the first LED module 12A so that the first LED module 12A can be generally aligned with the support chassis 14 and adjacently-positioned LED modules, such as the second LED module 12B. The translating structure 44 can allow the first LED module 12A to be moved into the aligned position while preventing or reducing the likelihood of the first LED module 12A coming into contact or interfering with the adjacently-positioned LED module 12B. The translating structure 44 can, therefore, reduce the likelihood of damage to the LED modules 12A, 12B, and can also reduce the overall cost of manufacturing and installing an LED display 10.

The translating structures 44 can provide for the movement of the first LED module 12A relative to the adjacently-positioned LED modules with little or no special care that needs to be taken by an installer user to prevent contact between the first LED module 12A and the adjacently-positioned LED modules. For example, an installer user can mount the first LED module 12A to the support chassis 14 by positioning the translating structures 44 with respect to the openings 50, followed by rotating the first LED module 12A with respect to the support chassis 14, such as by pulling the top edge 60A of the first LED module 12A, because the translating structures 44 can prevent contact between the first LED module 12A and an adjacently-positioned second LED module 12B. Therefore, the translating structures 44 can simplify the installation or uninstallation process for installers. The interaction between each of the translating structures 44 and the corresponding feature of the support chassis 14 that it engages, such as the opening 50, can provide for this controlled motion of the first LED module 12A with respect to adjacently-positioned LED modules, such as the second LED module 12B.

The translating structures 44 can also allow for very close spacing between the first LED module 12A and adjacently-positioned LED modules, such as the second LED module 12B, while still preventing or reducing the likelihood of the first LED module 12A contacting the adjacently-positioned LED module 12B during mounting or dismounting. In an example, the translating structures 44 can allow the distance between a last line of LEDs of the first LED module 12A and the first line of LEDs of the adjacently-positioned LED module 12B to be substantially the same as a distance between adjacent lines of LEDs within the first LED module 12A or within the adjacently-positioned LED module 12B. In an example, the translating structures 44 can provide for a close spacing between the LEDs of the first LED module 12A and the LEDs of each adjacently-positioned LED module 12B of between about 0 millimeters and about 2 millimeters. The translating structures 44 can provide for this close LED spacing while also allowing for front access to an installer during mounting or dismounting of the LED module 12A. The translating structures 44 can therefore allow for an overall LED display 10 having a closer pixel pitch (e.g., the distance between adjacent LEDs 20 having the same color) that is easier to install or uninstall than an LED display formed from LED modules that do not include at least one translating structures 44. The closer pixel pitch can allow the LED display 10 to have a higher overall resolution.

Each of the one or more translating structures 44 can be configured to engage the support chassis 14 throughout or substantially throughout the process of the LED module 12 moving from the tilted position to the aligned position during mounting of the LED module 12, or from the aligned position to the tilted position during dismounting of the LED module 12. Each of the one or more translating structures 44 can be configured to be weight bearing, for example by transferring weight from the LED module 12 to the support chassis 14 via the translating structures 44. In an example, each of the one or more translating structures 44 can be capable of bearing all or substantially all of the weight of the LED module 12 so that even if other securing structures (described below) fail, the LED module 12 will not fall from the support chassis 14.

As noted above, an LED module 12 can include one or more securing structures for securing the LED module 12 to the support chassis 14. Each securing structure can be a load-bearing structure that supports at least a portion of the weight of the LED module 12 after it has been rotated into the installed or aligned position. The securing structure can also provide a clamping force to clamp the LED module 12 to the support chassis 14 or hold the LED module 12 to the support chassis 14.

As described above, in an example, the one or more securing structures can include one or more mounting hooks 46 that can each engage a feature of the support chassis 14, such as an edge 64 of a mounting opening 58 or a rear surface of the support chassis 14 (FIGS. 8A and 8B). Each of the mounting hooks 46 can have the shape of an inverted letter "J", with a shorter first portion 66 coupled to, and extending generally rearward from, the rear face 42 of the frame 28 and a longer second portion 68 coupled to, and extending generally downward from, the first portion 66. The mounting hook 46 can also include a tapered engaging portion 70 at a distal end of the mounting hook 46, such as at a distal end of the second portion 68, which can provide for tight engagement between the mounting hook 46 and the feature of the support chassis 14.

Each of the one or more mounting hooks 46 can be configured to engage the support chassis 14 and secure the LED module 12 to the support chassis 14 when the LED module 12 is in the aligned position. The mounting hook 46 can also be configured to engage the support chassis 14 throughout or substantially throughout the process of the LED module 12 moving from the tilted position to the aligned position during mounting of the LED module 12, or from the aligned position to the tilted position during dismounting of the LED module 12.

Each of the one or more mounting hooks 46 can be configured to engage or captivate the support chassis 14 while the LED module 12 is mounted to the support chassis 14. In an example, the mounting hook 46 can be resilient, such as by being made from a resilient material for example a resilient polymer. As the LED module 12 is being installed (as described above), each of the mounting hooks 46 can be deformed or deflected by the support chassis 14 so that the support chassis 14 can remain engaged or captivated by the mounting hooks 46. An example of a resilient material that can be used to form the mounting hook 46 includes, but is not limited to, a polycarbonate polymer or acrylonitrile butadiene styrene (ABS).

The at least one securing structure can also include one or more securing structures that allow for coupling between the LED module 12A and the support chassis 14. In an example, as shown in FIG. 6, the LED module 12A can include a plurality of magnets 72 that are placed at various positions within the frame 28. The magnets 72 can magnetically engage portions of the support chassis 14 including a magnetizable metal, such as magnetized steel. The magnets 72 can be distributed across the rear face 42 of the frame 28 so that a holding force between the magnets 72 and the support chassis 14 can be evenly or substantially evenly applied. In an example, the magnets 72 can be made from a magnetic material such as neodymium (e.g., an alloy of neodymium, iron, and boron, also referred to as an NdFeB magnet). In an example, the magnets 72 can include NdFeB N35H having a coercivity of about 10.8 kilooersted (kOe), an intrinsic coercivity of about 17 kOe, a magnet performance of about 35 megagauss-oersteds (MGOe), and a magnetic flux density of about 1.2 millitesla (mT). In an example, the one or more magnets 72 can produce a force of at least about 25 newton (N) (about 5.5 pounds-force ($lb_f$), such as between about 26.5 N and about 53 N, inclusive (between about 6 $lb_f$ and about 12 $lb_f$, inclusive), between the LED module 12A and the support chassis 14.

Examples of other securing structures that can be used include, but are not limited to, clamps, latches, and fasteners (e.g., screws, nails, brads, and the like). Examples of latching securing structures that can be useful for securing an LED module to a support chassis are described in the commonly-assigned patents to Robert J. Lutz et al., U.S. Pat. No. 6,816,389, entitled "LED MODULE LATCH SYSTEM," filed on Jun. 12, 2003 and issued on Nov. 9, 2004, and to Robert James Lutz et al., U.S. Pat. No. 7,055,271, entitled "ELECTRONIC DISPLAY MODULE HAVING A FOUR-POINT LATCHING SYSTEM FOR INCORPORATION INTO AN ELECTRONIC SIGN AND PROCESS," filed on Oct. 17, 2003 and issued on Jun. 6, 2006, both of which are herein incorporated by reference in their entirety.

There can be instances when it is desirable to uninstall a particular LED module 12A from the LED display 10, such as when the LED module 12A is malfunctioning and needs to be maintained, repaired, or replaced. As described above, the gap between the LED module 12A and adjacently-positioned LED modules, such as a third LED module 12C mounted to the support chassis 14 above the first LED module 12A, can be very small, such as less than about 1 millimeter, for example less than about 0.5 millimeters. Small gaps can make dismounting the first LED module 12A from the support chassis 14 difficult because there is little space to provide for gripping or grasping the LED module 12A. In an example, the one or more fastenings structures, such as the magnets 72 or latches, can be actuable from a front side 74 of the LED module 12A, even if the securing structures are located on a back side 76 of the LED module 12A, such as on or proximate the rear face 42 of the frame 28.

Figure 9A:
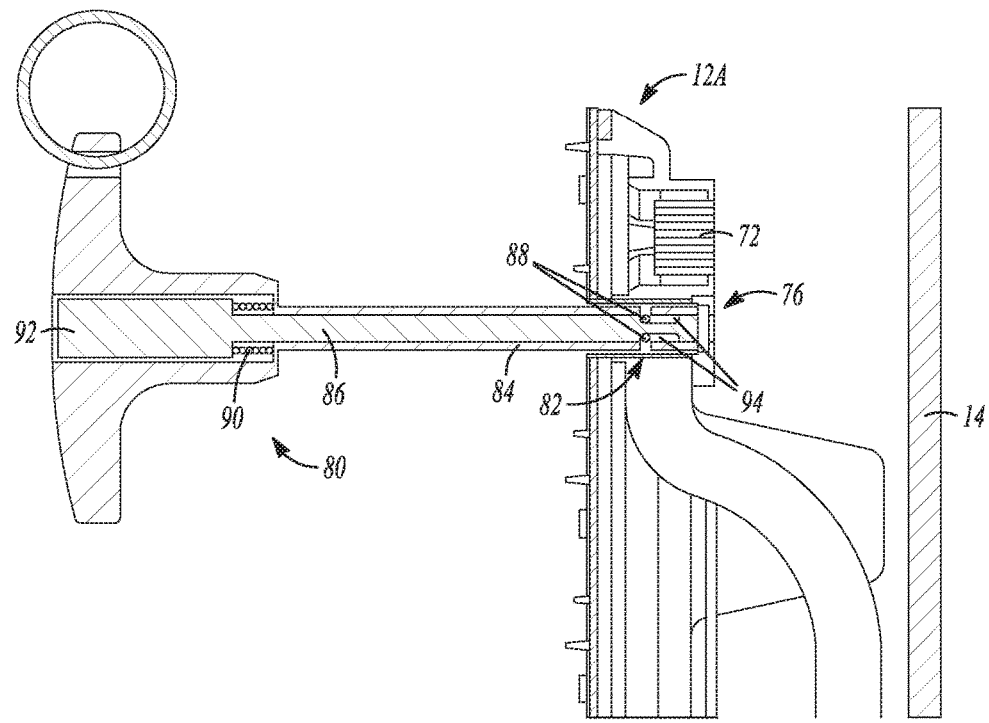
FIGS. 9A and 9B show views of an example LED engaging tool being used to disengage one or more securing structures of an example LED module.
Figure 9B:
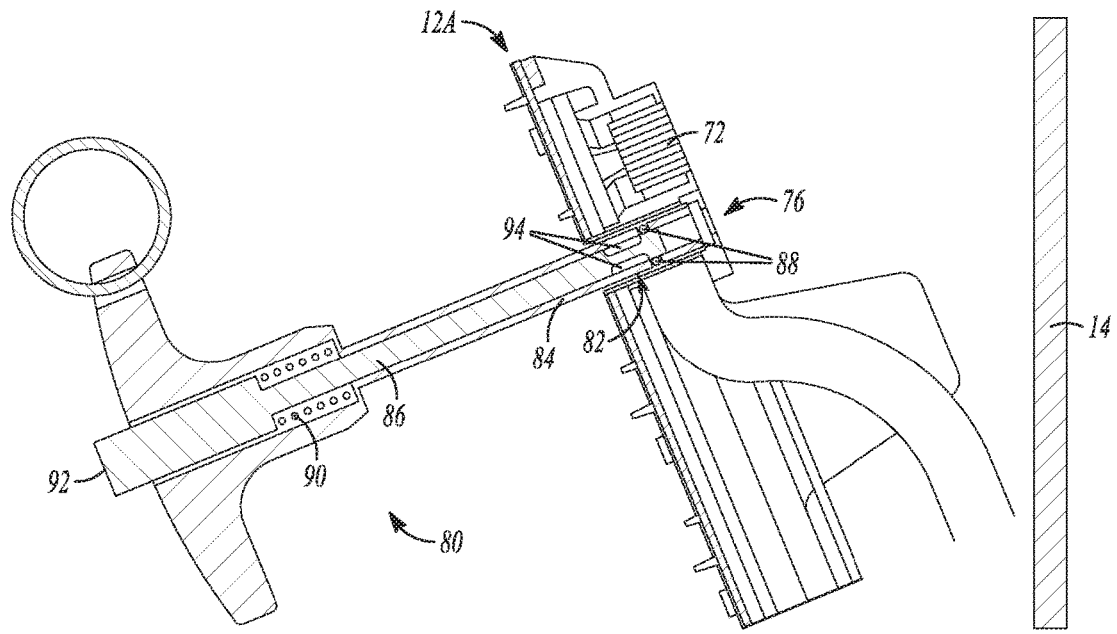

As shown in FIGS. 9A and 9B, the LED module 12A can include a lumen structure to receive a module engaging tool 80. FIGS. 9A and 9B further show a non-limiting example of the module engaging tool 80. The module engaging tool 80 can provide for actuation or disengagement of the one or more securing structures, such as the magnets 72. The LED module 12A can, for example, include a passageway 82 extending from the front side 74 of the LED module 12A to or near to the back side 76. The passageway 82 can be formed though one or more of the LED mask 26, the circuit board 22, and the frame 28, such as via a series of aligned openings. The module engaging tool 80 can be configured to engage the passageway 82. The module engaging tool 80 can also be configured to engage other portions of the LED module 12A, such as a lower edge 48A or an upper edge 60A.

In an example, a portion of the module engaging tool 80 can be inserted through the passageway 82 so that the module engaging tool 80 can engage the LED module 12A, such as by engaging the back side 76 or by engaging one or more structures within the passageway 82. In an example, the module engaging tool 80 can include a shaft 84 that can accommodate a piston 86. The piston 86 can be actuated by a user between a first position (FIG. 9A) and a second position (FIG. 9B). The piston 86 can be configured to engage and actuate one or more engaging structures, such as one or more bearings 88, between a retracted position, or installing position (FIG. 9A), and an expanded position, or engaging position (FIG. 9B). In an example, the piston 86 can be biased into the second position, such as with a spring 90, so that the piston 86 urges the bearing 88 into the expanded position. The piston 86 can be actuated by a user, such as by pushing a portion 92 of the piston 86 that extends out of the shaft 84, which can appear as a button 92 to the user. The actuation of the piston 86 to the first position can allow the one or more bearings 88 to settle into one or more grooves 94 so that the shaft 84 of the tool 80 can have a small enough cross-sectional profile to fit within the passageway 82. After the shaft 84 has been inserted into the passageway 82, the button 92 of the piston 86 can be released so that the spring 90 can bias the piston 86 to the second position, which can force the bearings 88 out of the grooves 94 and against an inner surface of the passageway 82 to lock the tool 80 in position relative to the LED module 12A. The passageway 82 can also include features, such as grooves, that can facilitate engagement with the bearings 88. The example engagement tool 80 shown in FIGS. 9A and 9B can be referred to as a ball lock pin. An example of a ball lock pin that can be used as the module engaging tool 80 is the ball lock pin sold by CarLane Manufacturing Co., St. Louis, Mo., USA, having part number CL-3-BLPT-1.50.

When the bearings 88 are engaging the passageway 82, a user-initiated force can be exerted on the LED module 12 via the tool 80, thereby providing for disengagement of the securing structures, such as by overcoming the magnetic force between one or more of the magnets 72 and the support chassis 14. In the example where the one or more translating structures 44 and the mounting hooks 46 are located proximate a bottom edge 48A of the LED module 12A, the passageway 82 can be located proximate the upper edge 60A so that less force is required by the installer user to pivot the LED module 12A and to disengage the securing structures.

Returning to FIGS. 8A and 8B, an LED module, such as the first LED module 12A, can include one or more positioning structures 96 that can assist an installer user to properly place the LED module 12A in a position relative to the support chassis 14. For example, as shown in FIG. 8A, the positioning structure 96 can be positioned on the rear face 42 of the frame 28 adjacent to, and in contact with, an edge 98 of the mounting opening 58 when the LED module 12A is in a desired position relative to the support chassis 14, e.g., such that each translating structure 44 is engaged with, or in position to engage, the opening 50 and so that the mounting hook 46 is engaged with, or in position to engage, the edge 64 of the mounting opening 58. A positioning structure 96 can be included on the LED module 12A to correspond to, and engage with, other features of the support chassis 14, such as openings, pegs, or pins.

In an example, one or more of the translating structures 44, the mounting hooks 46, and the positioning structures 96 can be formed as an integral part of the frame 28, such as by being integral with the rear face 42 of the frame 28. The translating structures 44, the mounting hooks 46, and the positioning structures 96 can be formed as integral with the frame 28 by molding the frame 28 in a shape that includes these features, such as by molding the frame 28 from a polymer to include one or more of the translating structures 44, the mounting hooks 46, and the positioning structures 96. The ability to integrate the translating members 44, the mounting hooks 46, or the positioning structures 96 with an LED module frame 28 can simplify the installation process in a cost effective manner by reducing the number of parts that need to be manufactured, kept track of, and used during installation. Examples of materials that the frame 28, including the translating structures 44, the mounting hooks 46, and the positioning structures 96, can be molded from are polymeric materials including moldable polymers, thermoformable polymers, or thermoplastic polymers, such as at least one of, but not limited to, a polycarbonate, and acrylonitrile butadiene styrene (ABS), or non-polymeric materials, such as steel, aluminum, and magnesium.

Figure 10:
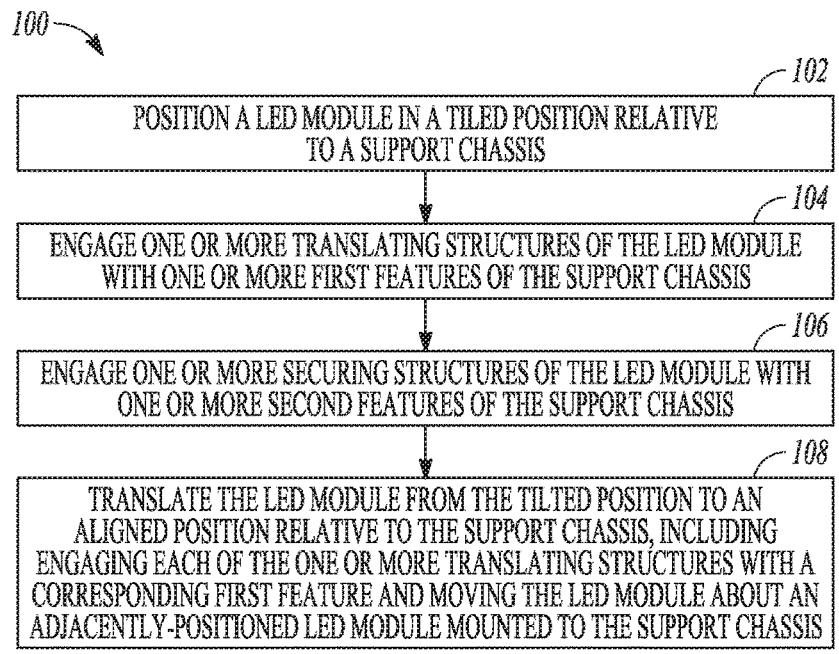
FIG. 10 illustrates an example method of mounting an example LED module to a support chassis.

FIG. 10 illustrates an example method 100 of installation, such as a method of mounting an LED module to a support chassis. The method 100 can include, at 102, positioning the LED module in a tilted position relative to the support chassis. At 104, one or more translating structures of the LED module can be engaged with one or more first features of the support chassis, such as one or more first openings within the support chassis, when the LED module is in the tilted position. At 106, one or more securing structures, such as one or more mounting hooks, can be engaged with one or more second features of the support chassis, such as one or more second openings within the support chassis. Engaging the one or more securing structures with the one or more second features can include at least partially supporting a weight of the LED module.

At 108, the LED module can be translated from the tilted position to an aligned position relative to the support chassis. During translation of the LED module, the one or more translating structures can engage the one or more first features, which can effectuate a translation of the LED module to avoid contact or interference with an adjacently-positioned LED module mounted to the support chassis. The translating of the LED module can move the LED module about the adjacently-positioned LED module to avoid contact or interference. As the LED module is translating from the tilted position to the aligned position, an angled portion of each of the one or more translating structures can slide along a corresponding first feature of the support chassis so that the LED module can be lifted and translated away from the adjacent LED module.

Figure 11:
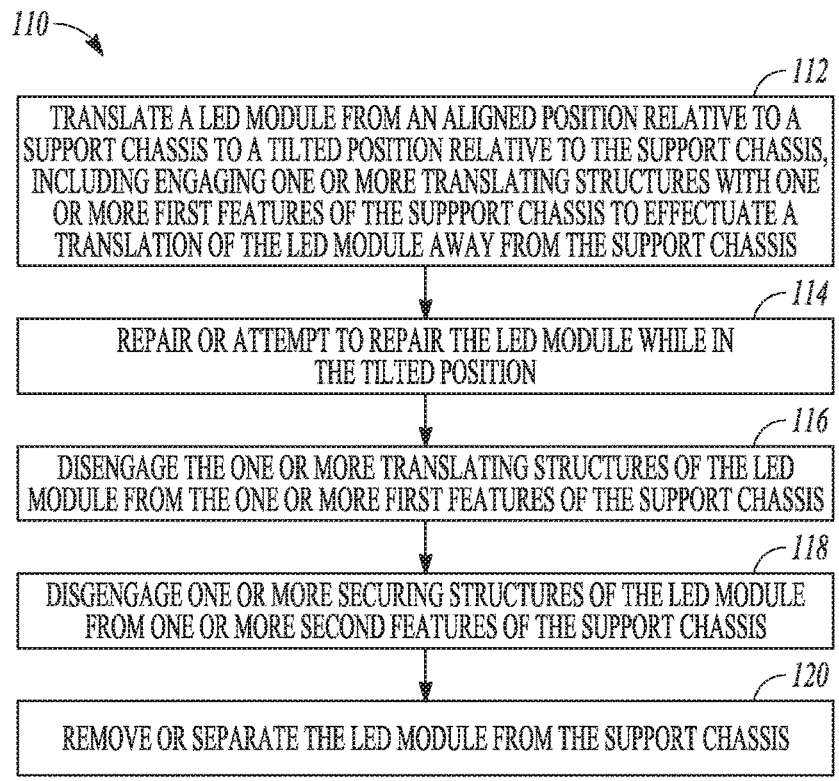
FIG. 11 illustrates an example method of dismounting an example LED module from a support chassis.

FIG. 11 illustrates an example method 110 of uninstalling, such as a method of dismounting an LED module from a support chassis. The method 110 can include, at 112, translating the LED module from an aligned position relative to the support chassis to a tilted position relative to the support chassis. During the translation of the LED module, the one or more translation structures can engage one or more first features of the support chassis, which can effectuate a translation of the LED module to avoid contact or interference with an adjacently-positioned LED module mounted to the support chassis. The translating of the LED module can move the LED module about the adjacently-positioned LED module to avoid contact or interference.

After translating the LED module from the aligned position to the tilted position, the method 110 can include one or more optional steps. At 114, the LED module can be repaired, or attempted to be repaired, while in the tilted position. Alternatively, or in addition to repair, at 116, the one or more translating structures of the LED module can be disengaged from the one or more first features of the support chassis. Prior to uninstalling, the LED module can be secured to the support chassis with one or more securing structures, such as one or more mounting hooks, configured to at least partially support the weight of the LED module. Alternatively, rather than or in addition to attempting to repair the LED module, the method 110 can include, at 118, disengaging the one or more securing structures from the one or more second structures. At 120, the LED module can be removed or separated from the support chassis.

In an example, a video display mounting frame or a video display module can include one or more security latches in addition to primary securing structures. A security latch can provide a safety mechanism whereby the module can resist disengaging from the support chassis during high winds or structural damage from some other source. The security latch can be configured to secure the video display module tightly to the support chassis or more loosely. In the event something such as high wind should overcome the primary securing structures; the security latch can retain engagement between the video display module and the support chassis until the primary securing structures can be repaired or reengaged.

In an example, the primary securing structures can include magnets that produce a magnetic force when placed in proximity to one or more mating metal structures. If high winds should provide sufficient force against a video display module to overcome the magnetic force of the magnets, the security latch can retain engagement between the video display module with close enough proximity such that when the high winds cease, the magnetic force between the magnets and the one or more mating metal structures can draw the video module back to its original position.

The security latch can include a latch body that can be movable between an unlatched position and a latched position. During installation, the video display module can be provided with securing structures on a bottom edge of the video display module and then tilted towards the support chassis to an aligned position. Upon removal, the top of the module can be tilted away from the support chassis. The security latch can be positioned near the top edge of the module to engage a corresponding structure on the support chassis. However, the one or more security latches can be placed anywhere on the module, such as on one or more side edges or a bottom edge. The module itself also can be oriented to mount or dismount from at least one of the sides, the bottom, or the top. The module also can be configured to mount or dismount directly in a direction substantially perpendicular to a mounting structure plane.

The security latch can be biased to remain in the latched position, such as with a biasing mechanism, for example a spring. As the video display module is tilted towards an aligned position, the latch body can engage a corresponding structure of the support chassis, such as an edge of the support chassis. Because the latch body is movable, the contact with the support chassis can cause the latch body to move to an unlatched position so that the module can be mounted. As the video display module is fully aligned against the support chassis, the latch body may no longer be engaged with the corresponding structure such that the latch body can return to a latched position.

Figure 12A:
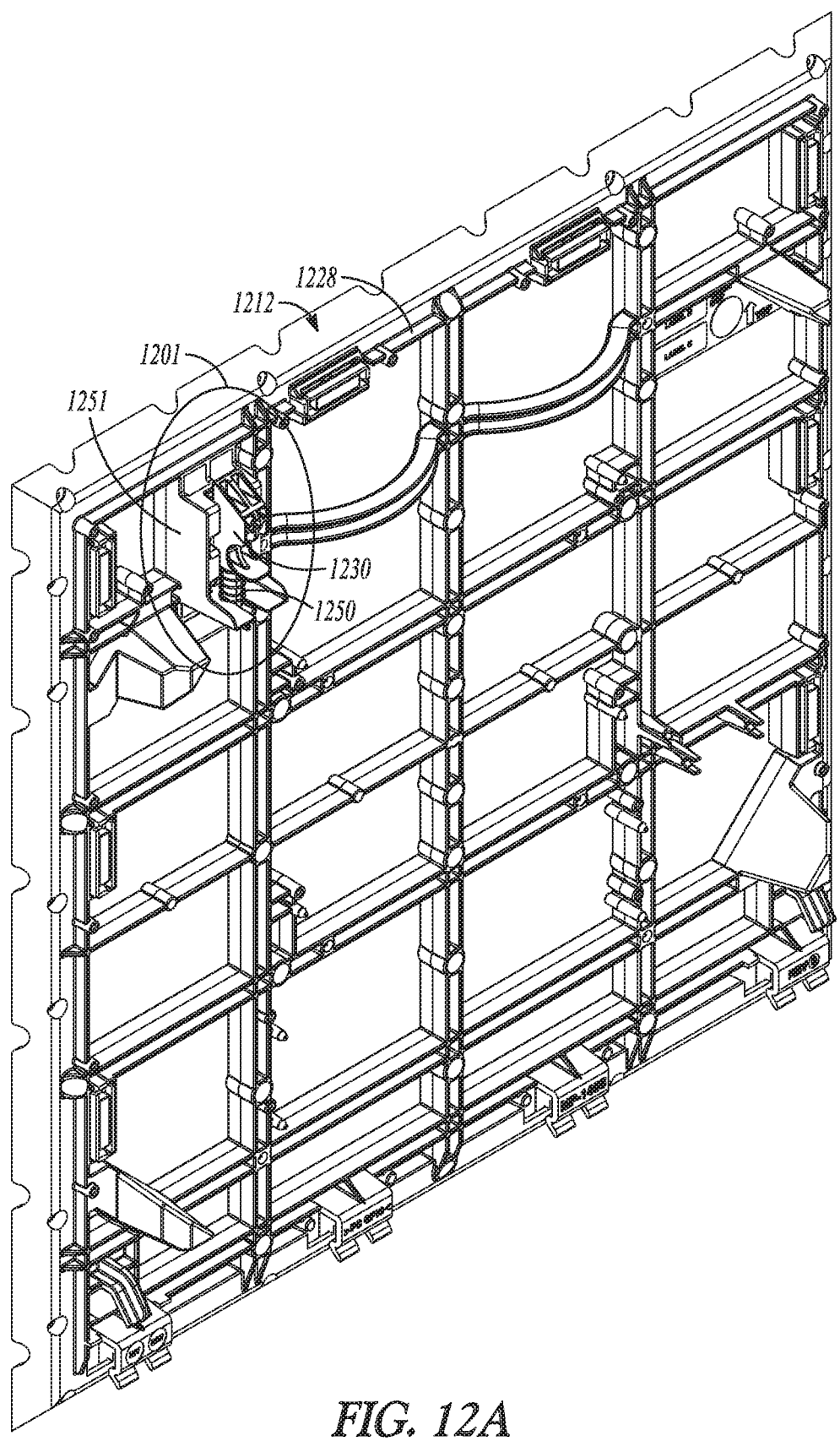
FIG. 12A illustrates an isometric view of an example video display module including an example security latch.
Figure 12B:
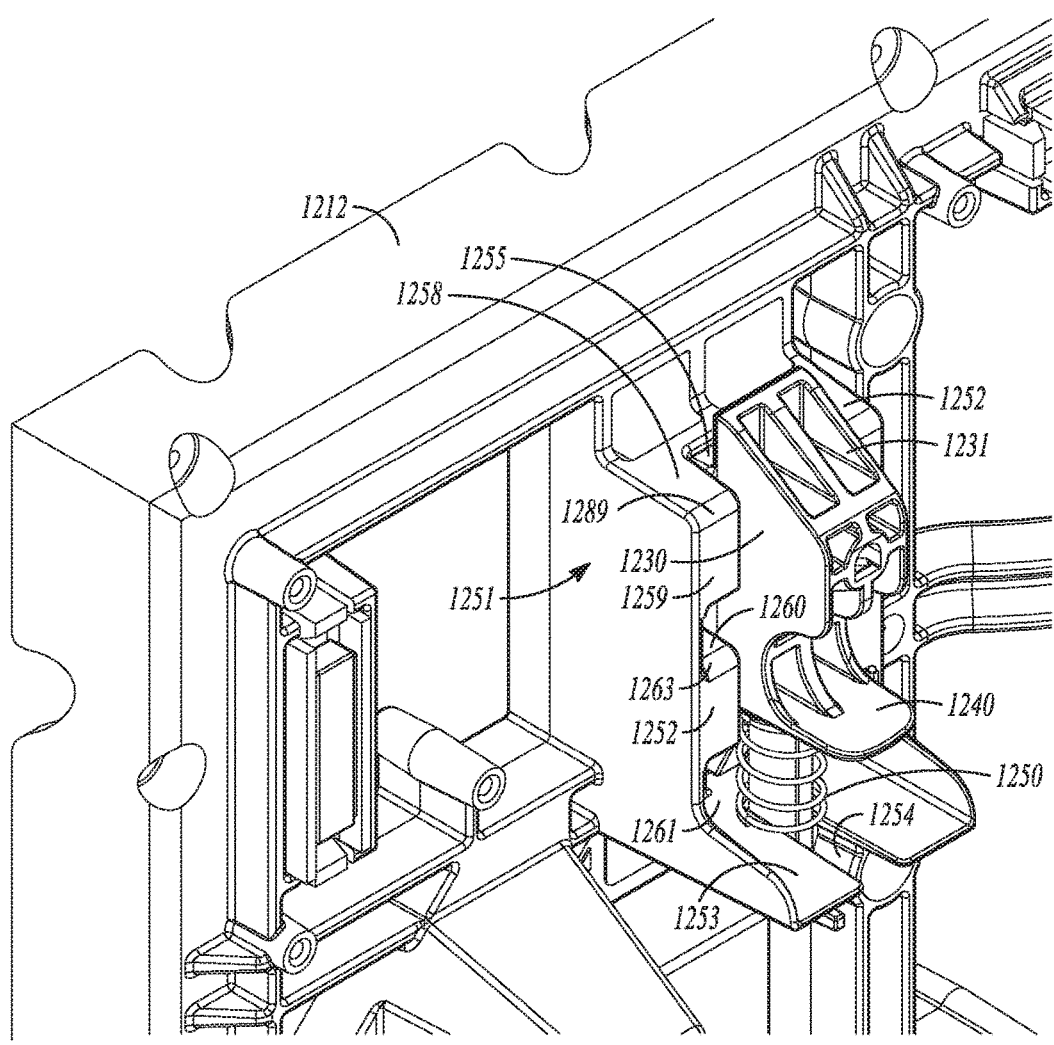
FIG. 12B illustrates a close-up view of the example a security latch of FIG. 12A.
Figure 12C:
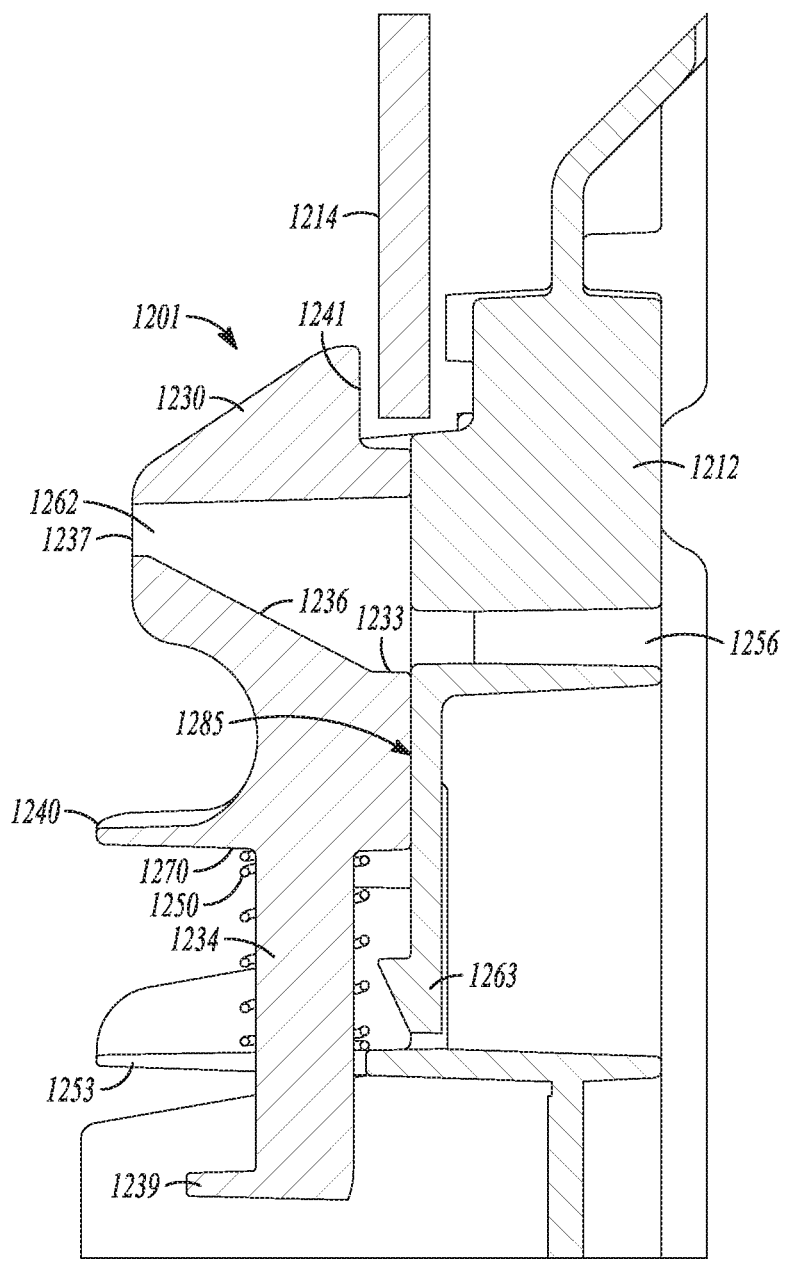
FIG. 12C illustrates a cross-sectional view of the example security latch of FIGS. 12A and 12B.

FIGS. 12A-12C illustrate an example security latch 1201 as viewed from the rear of a video display module 1212. The security latch 1201 can include a latch body 1230, a spring 1250, and a mating structure 1251. The security latch 1201 can be positioned on the video display module 1212 and can be integral with a frame 1228 of the video display module 1212. Alternatively, the security latch 1201 can be a separate structure that is attached, mounted, or otherwise coupled with the video display module 1212. The latch body 1230 can be generally cylindrical, generally rectangular, or can have a combination of rounded and squared edges and corners. The latch body 1230 can slide up and down in the mating structure 1251 between a first position (e.g., a latched position) and a second position (e.g., an unlatched position). In an example, when in the latched position, the security latch 1210 is engaged with a corresponding structure on a support chassis 1214 (FIG. 12C), and while in the unlatched position the security latch 1210 is not engaged with the corresponding structure of the support chassis 1214. The latch body 1230 can be subject to a biasing force applied by a biasing mechanism, such as a spring 1250. The spring 1250 can bias the latch body 1230 toward the first position or the second position. In an example, the spring 1250 can bias the latch body 1230 toward the latched position. Other biasing structures can be used rather than the coiled spring 1250 shown, such as a flat spring, a resilient material such as rubber, or other resilient structures.

Figure 13C:
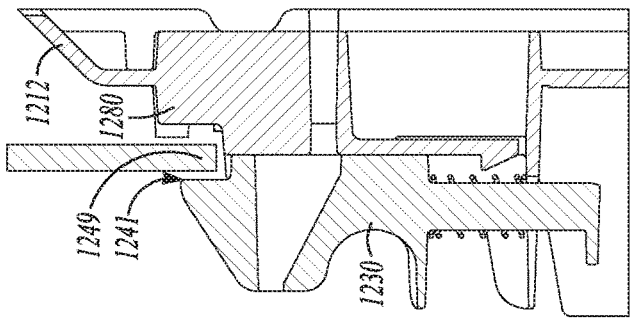
FIG. 13A-C illustrates an example of the motion of an example security latch as it is being installed.
Figure 13B:
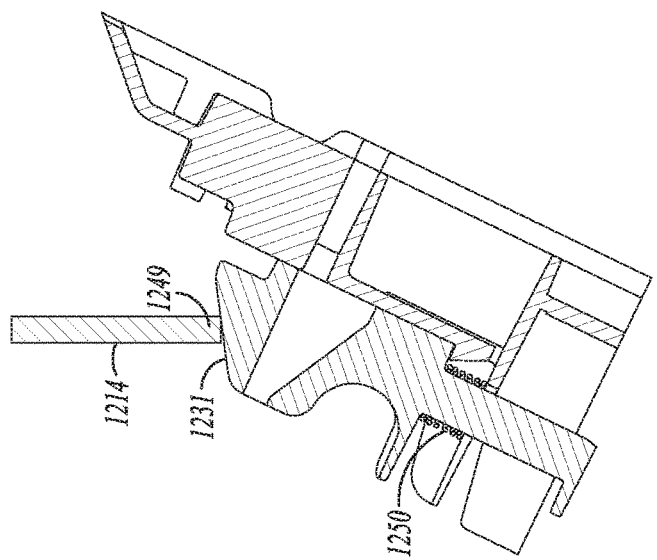
Figure 13A:
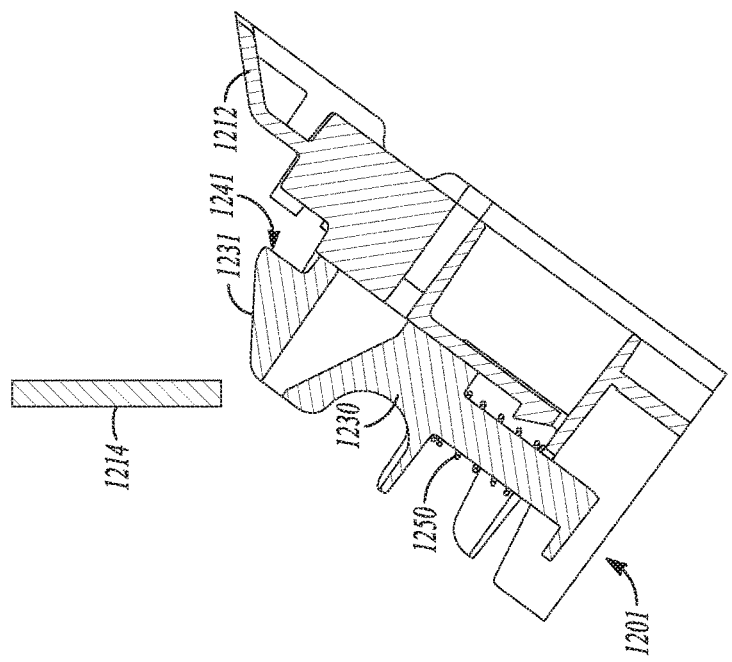

In operation, the security latch 1201 can prevent or reduce the likelihood of the video display module 1212 becoming disengaged with the support chassis 1214 and separated from the support chassis 1214 even if other securing structures, such as magnets, other latches, or fasteners, have lost their hold on the video display module 1214. FIGS. 13A-13C illustrate an example of the operation of the security latch 1201 as the video display module 1512 is being mounted to the support chassis 1214. In FIG. 13A, the video display module 1212 is tilted with respect to the support chassis 1214 and is being moved towards the support chassis 1214. In FIG. 13A, the latch body 1230 has not yet engaged the support chassis 1214 such that the latch body 1230 remains in a latched position, biased by the spring 1250. In FIG. 13B, a ramped portion 1231 of the latch body 1230 has contacted an edge 1249 of the support chassis 1214. The surface of the ramped portion 1231 can be a curved surface or a planar surface. The ramped portion 1231 of the latch body 1230 can slide along the edge 1249, which can cause the latch body 1230 to be pushed toward the unlatched position. If a biasing mechanism, such as the spring 1250, is used to bias the latch body 1230 toward the latched position, the pushing of the latch body 1230 by the support chassis 1214 can cause the biasing structure to be compressed. After the edge 1249 of the support chassis 1214 has traveled along at least a portion of the ramped portion 1231, the edge 1249 no longer contacts the latch body 1230, and the spring 1250 or other biasing structure can push the latch body 1230 back into the latched position such that a latch face 1241 of the latch body 1230 can engage the support chassis 1214. The engagement between an engaging surface, such as the latch face 1241, and the support chassis 1214 can interfere or prevent the video display module 1212 becoming disengaged from the support chassis 1214.

FIG. 12C shows a cross-sectional view of the security latch 1201 in a latched position. A biasing structure, such as the spring 1250, can be in an extended position so that the latch body 1230 is biased upwardly into the latched position. When in the latched position, a latch face 1241 can contact or engage the support chassis 1214 to prevent or avoid forward movement of the video display module 1212 so that the video display module 1212 can be prevented from being disengaged and removed from the support chassis 1214. A lower portion of the latch body, such as a leg 1234, can be provided with dimensions that can allow installation of the spring 1250 around it. The leg 1234 can have a lateral dimension that is smaller than an inner diameter of the spring 1250. The leg 1234 can include an extension 1239 that can project from proximate a bottom end of the leg 1234. The extension 1239 can retain the spring 1250 in order to prevent the spring 1250 from falling off the leg 1234. A first end of the spring 1250 (e.g., the upper end) can engage a lower surface 1270 of the latch body 1230 and a second end of the spring 1250 (e.g., the lower end) can engage the base 1253. A boss 1263 can be located in the one or more mating structures 1251 to limit the travel of the latch body 1230 in the direction of the unlatched position. The extension 1239 is shown at the lower end of the leg 1234.

Figure 14A:
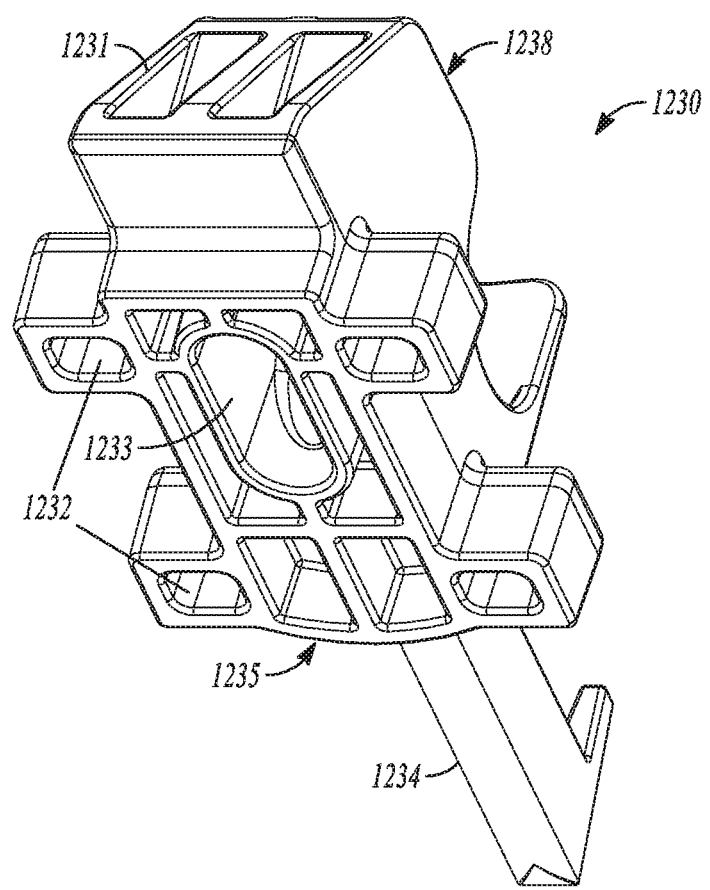
FIG. 14A illustrates an isometric view of an example latch body of the example securing latch of FIGS. 12A-12C.
Figure 14B:
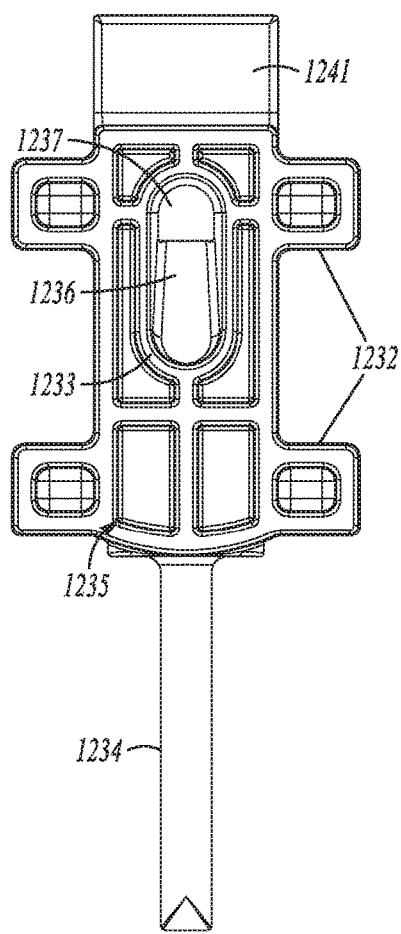
FIG. 14B illustrates a front view of the example latch body of FIG. 14A.
Figure 14C:
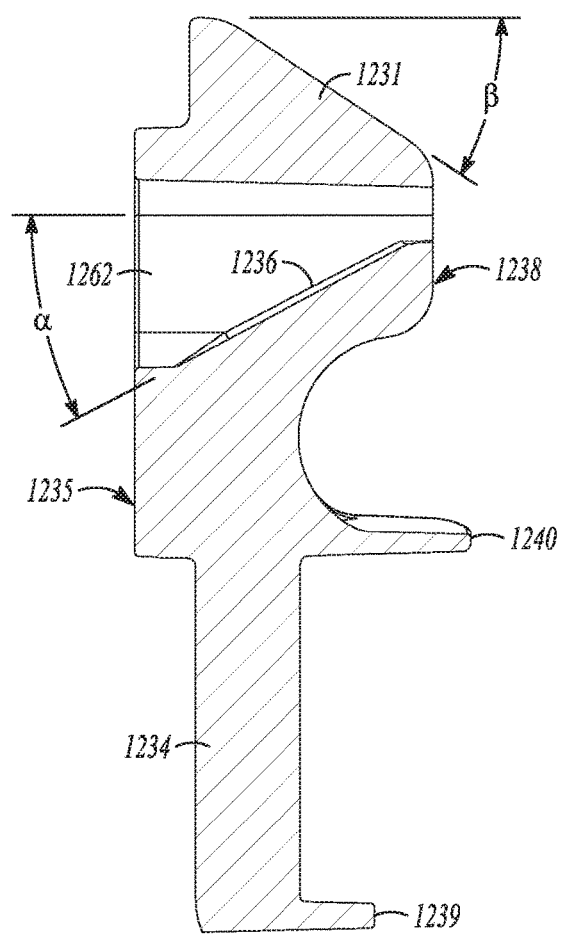
FIG. 14C illustrates a cross sectional view of the example latch body of FIGS. 14A and 14B.

FIGS. 14A-14C show further details of an example latch body 1230. The latch body 1230 can include a front face 1235 that can face towards a rear face of a frame of the video display module 1212. The latch body 1230 can also include a rear face 1238 that opposes the front face 1235. The latch body 1230 can include a ramped portion 1231 configured to engage the support chassis 1214, as described above. The ramped portion 1231 can form an acute angle β with respect to a plane that is normal to the front face 1235 and the rear face 1238. In an example, the acute angle β can be from about 10 degrees to about 60 degrees, such as from about 20 degrees to about 45 degrees, for example about 33 degrees. The angle β can allow the latch body 1230 to be forced progressively downwards as the support chassis 1214 slides along the ramped portion 1231 while the video display module 1212 is moved into engagement with the support chassis 1214 (as described above with respect to FIGS. 13A-13C).

The latch body 1230 can have one or more protrusions 1232 extending laterally from the sides of the latch body 1230. The protrusions 1232 can be retained by a portion of a mating structure 1251 (See FIG. 12B), such as by one or more brackets 1252 (described in more detail below). The mating structure 1251 can engage the latch body 1230 as the latch body 1230 moves between the latched position and the unlatched position or vice versa. As shown in FIG. 14A, the protrusions 1232 can extend farther outwardly than the rear portion of the latch body 1230 and can be substantially thinner than the rest of the latch body 1230.

The latch body 1230 can also comprise an opening 1233 defined within the front face 1235 of the body. The opening 1233 can open into a cavity 1262 within the latch body 1230. An inclined structure, such as a ramp 1236, can be included in the cavity 1262. The inclined structure can incline upwardly towards the rear face 1238 of the latch body 1230. The inclined structure may also be placed on another part of the latch body 1230 for example on a side of the latch body. In an example, the rear face 1238 can define a rear opening 1237, and the ramp 1236 can be inclined upward toward the rear opening 1237. The ramp 1236 can form an acute angle α with respect to a plane that is normal to the front face 1235 and the rear face 1238. In an example, the angle α is angled in a direction that is opposite of the angle direction of the acute angled β of the ramped portion 1231. In an example, the ramp 1236 can have an angle α of from about 10 degrees to about 60 degrees, such as from about 20 degrees to about 45 degrees, for example about 27 degrees. The angled surface of the ramp 1236 can be a slightly curved surface or a planar surface. The rear opening 1237 in the rear face 1238 of the latch body 1230 can be shaped like a keyway, with a top portion being rounded and the bottom portion being squared off. The ramp 1236 can provide a mechanism to bias the latch body 1230 against the biasing force caused by the biasing structure, such as the spring 1250.

One or more mating structures 1251 can be included to provide a support framework for the latch body 1230 as the latch body 1230 slides between the latched position and the unlatched position. The one or more mating structures 1251 can have sufficient strength to withstand the forces exerted on the security latch 1201, such as high winds blowing against the video display module 1212. In an example, the one or more mating structures 1251 and the latch body 1230 can be sufficiently strong such that they can withstand the force exerted on the video display module 1212 by winds having a speed of at least about 100 miles per hour (mph), such as at least about 140 mph, for example, at least about 170 mph. As shown in the example of FIG. 12B, the mating structure 1251 can include one or more brackets 1252, a base 1253, a latch body channel 1255, and a slot 1254. The mating structure 1251 can also include a removal tool hole 1256 (FIG. 12C) that can provide access for a removal tool through the mating structure 1251 so that the removal tool can access the latch body 1230. The mating structure 1251 can be integral with the frame 1228 of the video display module 1212. Alternatively, the mating structure 1251 can be a separate structure that is not integral with the frame 1228, but that is adhered, fastened, or otherwise coupled to the frame 1228. The mating structure 1251 can be substantially rectangular with one or more side members 1257 forming one or more side structures and a spring base 1253 forming a bottom structure. The mating structure 1251 can also be substantially circular. The side members 1257 can form a backing for one or more brackets 1252. The brackets 1252 can be generally L-shaped with a bracket first member 1258 that can extend generally rearward substantially orthogonally to the video display module 1212 and a bracket second member 1259 that extends substantially parallel to the video display module 1212. The L-shape of the brackets 1252 can partially enclose the protrusions 1232 and can allow the protrusions 1232 to slide from the latched to the unlatched position, while the brackets 1252 can retain the latch body 1230. The brackets 1252 can cover the protrusions 1232 in both the latched position and the unlatched position. The brackets 1252 can function to retain the latch body 1230 during operation of the security latch 1201. The bracket first member 1258 can provide a stop for the protrusions 1232 and can limit further travel of the latch body 1230 due to the biasing force from the spring 1250. Openings at a bottom end of the brackets 1252 can allow the protrusions 1232 to be inserted or removed from the brackets 1252. In an example, there is an upper bracket space 1260 between an upper bracket 1289 and a lower bracket 1263 and a lower bracket space 1261 below the lower bracket 1263 (e.g., between the lower bracket 1263 and the base 1253). If the latch body 1230 is depressed farther than its normal operation, the protrusions 1232 can clear the brackets 1252 and the latch body 1230 and the spring 1250 can be removed from the security latch 1201 for assembly or disassembly.

The brackets 1252 can define a central channel 1255 in which the latch body 1230 can sit. A rear surface 1285 of the frame 1228 (best seen in FIG. 12C) can form a surface upon which the protrusions 1232 and the front face 1235 of the latch body 1230 (best seen in FIG. 14A) can slide when the latch body 1230 moves from the latched position to the unlatched position and vice versa. The bottom of the mating structure 1251 can form a base 1253 and the lower end of a spring 1250 or other biasing means can rest against the base 1253. The base 1253 can have a slot 1254 that can receive the leg 1234 of the latch body 1230. The slot 1254 can allow the leg 1234 to slide back and forth into and out of the mating structure 1251 while the base 1253 retains the spring 1250.

Figure 15A:
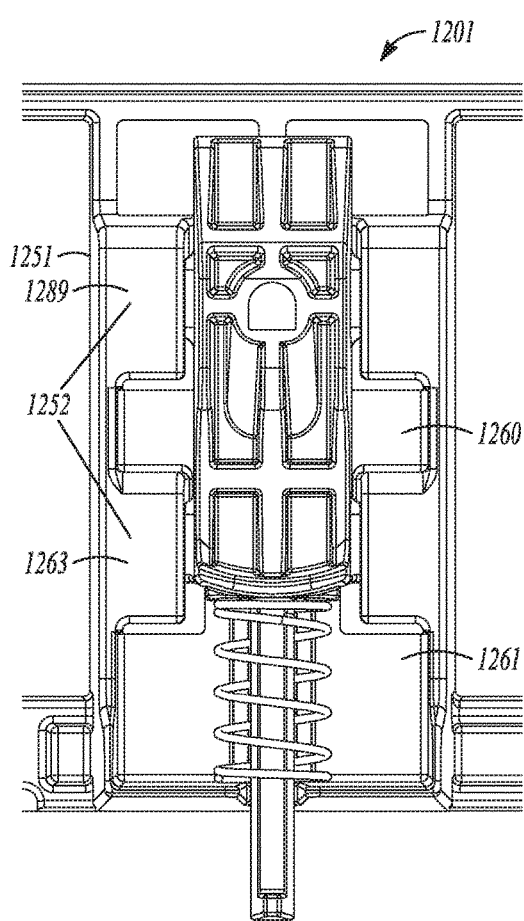
FIGS. 15A and 15B illustrate a comparison of a rear view of the security latch with the latch body installed in a mating structure and a separate view of the latch body alone.
Figure 15B:
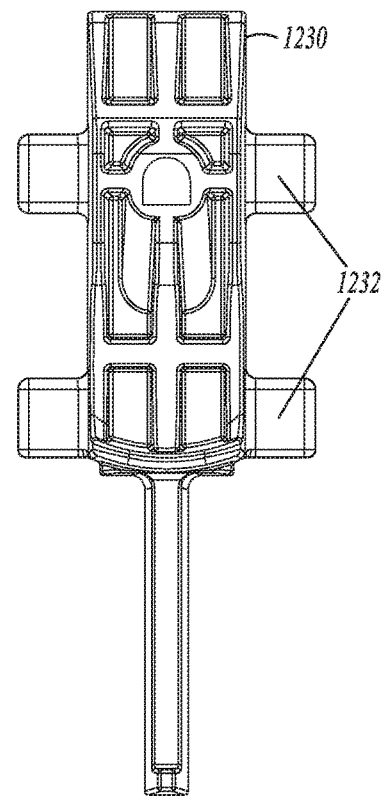

FIGS. 15A and 15B show rear views of the security latch 1201 with the latch body 1230 installed in the mating structure 1251 and a rear view of the latch body 1230 alone, respectively. The protrusions 1232 can be seen on the latch body 1230 of FIG. 15B, while the protrusions 1232 are obscured by the brackets 1252 in FIG. 15A. FIG. 15A shows the position of the upper bracket 1289, lower bracket 1263, upper bracket space 1260 and lower bracket space 1261.

Figure 16A:
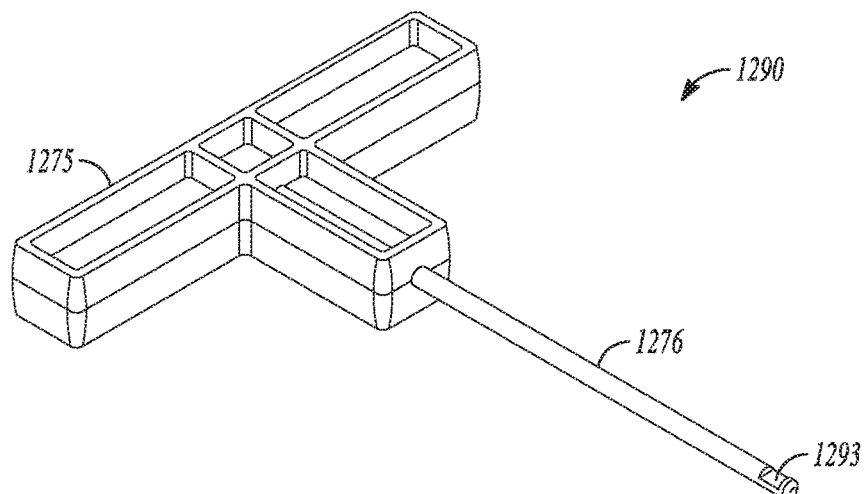
FIG. 16A illustrates an isometric view of a removal tool.
Figure 16B:
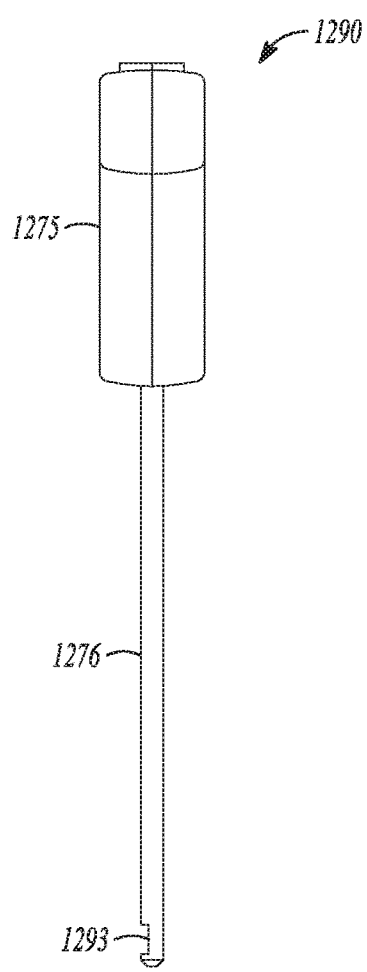
FIG. 16B illustrates a side view of a removal tool

A removal tool 1290 shown in FIGS. 16A-B, can have a tool handle 1275, a tool shaft 1276, and a notch 1293 at the tip of the tool shaft. The removal tool 1290 can be used by an installer to remove a video display module 1212 from the support chassis 1214, from the front of the display.

Figure 17A:
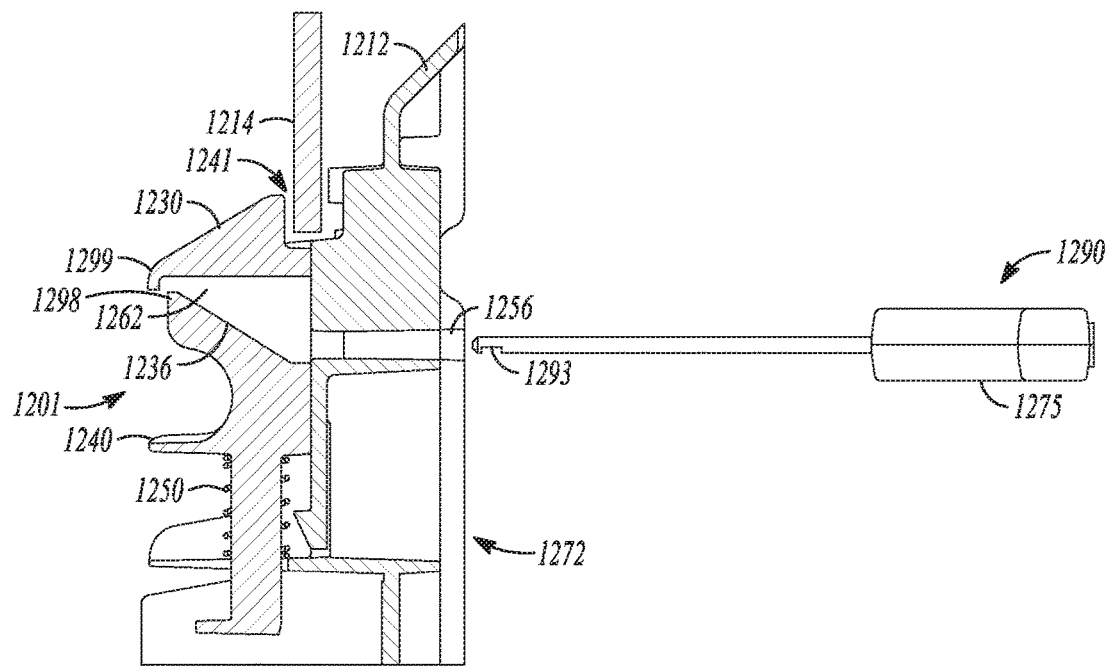
FIG. 17A-C illustrates views of a removal tool engaging the example security latch to permit disengaging the video display module.

FIG. 17A shows an example of a side cutaway view of a security latch 1201 shown in the latched position. The support chassis 1214 can prevent the video display module 1212 from becoming disengaged from the support chassis 1214 because the latch body 1230, and specifically the latch face 1241, can engage the support chassis 1214. As discussed above, a removal tool channel 1256 can be provided through the security latch 1201 and through the video display module 1212. In an example, best seen in FIGS. 17A and 17B, the removal tool channel 1256 can extend through the entire video display module 1212 so that the removal tool channel 1256 can be accessed from a front face 1272 of the video display module 1212. The removal tool channel 1256 can be aligned with the a portion of the front opening 1233 in the front face 1235 of the latch body 1230, e.g., so that the removal tool channel 1256 through the video display module 1212 is aligned with at least a portion of the cavity 1262 comprising the ramp 1236 (described above).

Figure 17B:
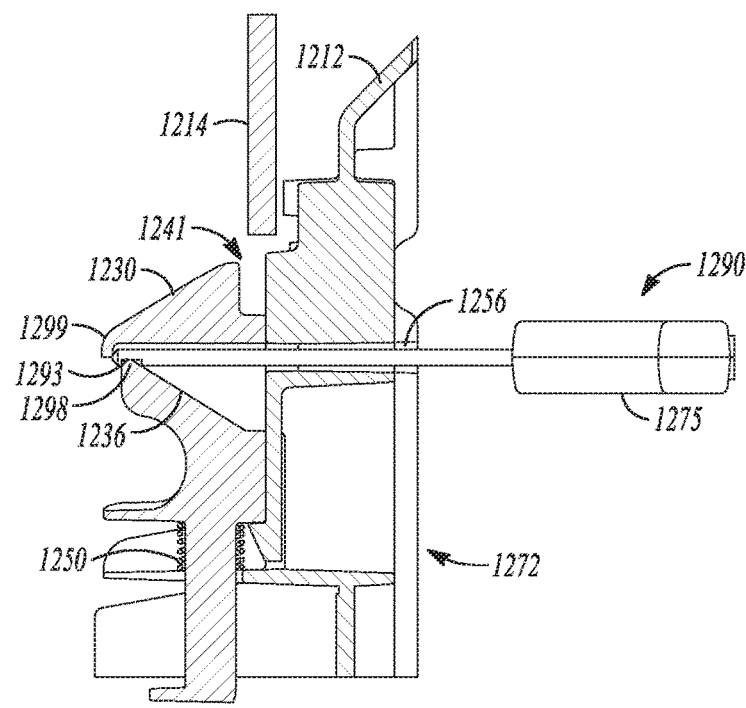
Figure 17C:
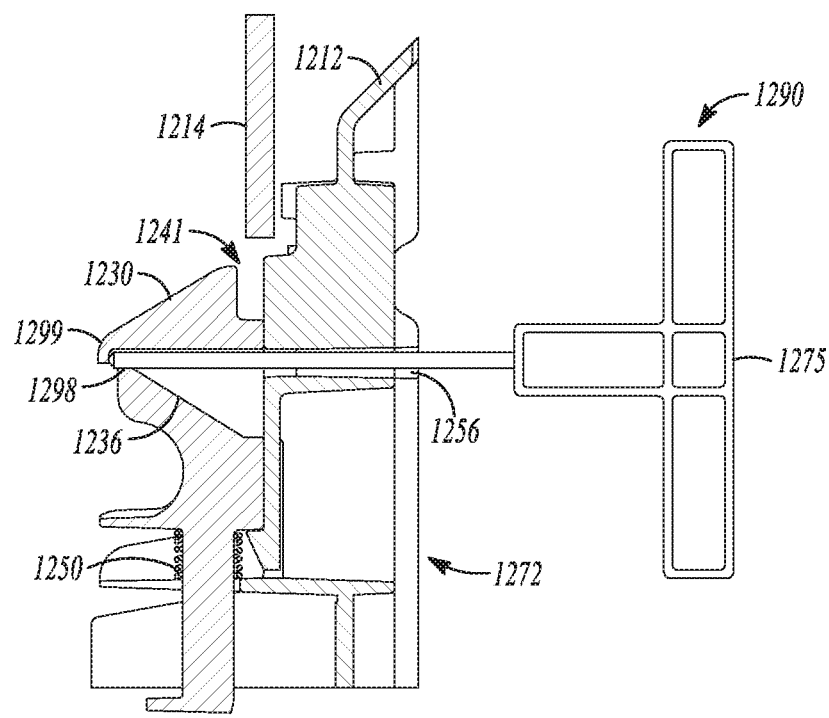

FIGS. 17A-17C show an example of the use of the removal tool 1290. As shown in the example of FIGS. 17A-17C, the removal tool 1290 can be inserted through the tool removal channel 1256 and into the cavity 1262. The removal tool 1290 can be inserted through the removal tool channel 1256 via a hole or other opening in the front face 1272 of the video display module 1212. After traversing the removal tool channel 1256 in the video display module 1212, the removal tool 1290 can then enter the cavity 1262 in the latch body 1230. The removal tool 1290 can then engage and slide along the ramp 1236 and move the latch body 1230 toward the unlatched position against the biasing force of the spring 1250 as the removal tool 1290 is pushed rearward. As seen in FIG. 17B, once the removal tool 1290 moves the latch body 1230 completely to the unlatched position, e.g., so that the latch body 1230 is no longer engaging the support chassis 1214, an installer can remove the video display module 1212 from the video display assembly.

The removal tool 1290 can allow an operator to remove the video display module 1212 from the front of the unit. Once the removal tool 1290 has been inserted fully into the tool removal channel 1256, the notch 1293 at the tip of the removal tool 1290 can be engaged with a structure of the latch body 1230, such as by hooking onto an edge 1298 at the end of the ramp 1236. With the notch 1293 engaged with the latch body 1230, an installer can pull the video display module 1212 away from the support chassis 1214. The latch body 1230 can have a lip 1299 that prevents the removal tool 1290 from being inserted too far into the removal tool channel 1256. If the notch 1293 is hooked on the lip 1299 of the latch body 1230, an installer can rotate the removal tool 1290, as shown in FIG. 17C. The rotation of the removal tool 1290 can allow the notch 1293 to disengage from the latch body 1230, such that the removal tool 1290 can be withdrawn from the video display module 1212. The tool removal channel 1256 can be small enough so that it will not interfere with the spacing of the light emitting elements on the video display module 1212.

The security latch 1201 can also be configured to allow for tool-less removal from a rear side of the video display assembly. In an example, the rear face 1238 of the latch body 1230 can include a handle 1240 that can be gripped or otherwise manipulated by an installer or other user to move the latch body 1230 against the biasing force of the spring 1250 to move the latch body 1230 from the latched position to the unlatched position. In this manner, the video display module 1212 can be removed from the support chassis 1214 from the rear without the use of any tools.

To better illustrate the present video displays, modules, and methods, a non-limiting list of Examples is provided here:

Example 1 can include subject matter (such as an apparatus, a device, a method, or one or more means for performing acts), such as can include a frame for a video display module. The subject matter can comprise a first face configured for coupling with a light-emitting element circuit board, a second face configured for mounting to a support chassis, one or more first securing structures coupled to the second face, the one or more first securing structures being configured to mount or secure the frame to the support chassis, and one or more security latches each comprising a latch body movable between a latched position and an unlatched position, each latch body configured to engage a first feature of the support chassis to prevent removal of the video display module when in the latched position.

Example 2 can include, or can optionally be combined with the subject matter of Example 1, to optionally include a frame wherein the latch body is configured to be biased toward the latched position.

Example 3 can include, or can optionally be combined with the subject matter of one or any combination of Examples 1 and 2, to optionally include one or more second securing structures differing from the first securing structures.

Example 4 can include, or can optionally be combined with the subject matter of one or any combination of Examples 1-3, to optionally include a frame wherein the one or more first securing structures comprise a first one of one or more magnets, one or more latches, one or more securing structures integral with the second face, and one or more fasteners, and the second securing structures comprises a second one of the one or more magnets, the one or more latches, the one or more securing structures integral with the second face, and the one or more fasteners.

Example 5 can include, or can optionally be combined with the subject matter of one or any combination of Examples 1-4, to optionally include one or more third securing structures differing from the first securing structures and the second securing structures.

Example 6 can include, or can optionally be combined with the subject matter of one or any combination of Examples 1-5, to optionally include a frame wherein the one or more first securing structures comprise a first one of one or more magnets, one or more latches, one or more securing structures integral with the second face, and one or more fasteners, the one or more second securing structures comprises a second one of the one or more magnets, the one or more latches, the one or more securing structures integral with the second face, and the one or more fasteners, and the one or more third securing structures comprise a third one of the one or more magnets, the one or more latches, the one or more securing structures integral with the second face, and the one or more fasteners.

Example 7 can include, or can optionally be combined with the subject matter of one or any combination of Examples 1-6, to optionally include one or more translating structures coupled to the second face, each translating structure configured to engage a second feature of the support chassis effectuating a translation of the video display module to avoid contact or interference with an adjacently-positioned video display module, mounted to the support chassis, during a mounting or a dismounting procedure.

Example 8 can include, or can optionally be combined with the subject matter of one or any combination of Examples 1-7, to optionally include the one or more security latches further comprises a mating structure engageable by the latch body, wherein the mating structure retains the latch body when the security latch is in an unlatched and a latched position.

Example 9 can include, or can optionally be combined with the subject matter of one or any combination of Examples 1-8, to optionally include the mating structure of each of the one or more security latches maintains an alignment of the latch body with respect to the second face when the latch body moves between the latched position and the unlatched position.

Example 10 can include, or can optionally be combined with the subject matter of one or any combination of Examples 1-9, to optionally include the mating structure comprises a base and one or more brackets configured to retain a portion of the latch body.

Example 11 can include, or can optionally be combined with the subject matter of one or any combination of Examples 1-10, to optionally include the one or more brackets comprises a first member that is substantially orthogonal to the second face, the first member providing a stop for motion of the latch body from the unlatched position to the latched position, a second member that is substantially parallel to the second face, the second member being configured to retain a portion of the latch body.

Example 12 can include, or can optionally be combined with the subject matter of one or any combination of Examples 1-11, to optionally include the latch body is biased toward the latched position by a biasing structure.

Example 13 can include, or can optionally be combined with the subject matter of one or any combination of Examples 1-12, to optionally include the biasing structure comprises a spring.

Example 14 can include, or can optionally be combined with the subject matter of one or any combination of Examples 1-13, to optionally include the latch body further comprises a lower portion configured to fit inside the inner diameter of the spring.

Example 15 can include, or can optionally be combined with the subject matter of one or any combination of Examples 1-14, to optionally include the latch body comprises a ramped portion configured to engage the first feature of the support chassis during mounting of the video display module to push the latch body toward the unlatched position.

Example 16 can include, or can optionally be combined with the subject matter of one or any combination of Examples 1-15, to optionally include the latch body further comprises a front face proximate to the second face of the frame and an opposing rear face, a ramp between the front face and the rear face; and an opening in the front face to permit access to the ramp.

Example 17 can include, or can optionally be combined with the subject matter of one or any combination of Examples 1-16, to optionally include the frame further comprises a removal tool hole extending between the first face and the second face, the removal tool hole being substantially aligned with the opening in the front face of the latch body.

Example 18 can include, or can optionally be combined with the subject matter of one or any combination of Examples 1-17, to optionally include the removal tool hole in the latch body is configured to receive a removal tool configured to engage the ramp to push the latch body from the latched position to the unlatched position.

Example 19 can include, or can optionally be combined with the subject matter of one or any combination of Examples 1-18, to optionally include the latch body further comprises one or more protrusions projecting outwardly from the latch body, wherein the one or more protrusions engage the mating structure in the security latch.

Example 20 can include, or can optionally be combined with the subject matter of one or any combination of Examples 1-19, to optionally include the one or more security latches are actuable from a front side of the video display module, the front side oriented in a direction of the first face of the frame.

Example 21 can include, or can optionally be combined with the subject matter of one or any combination of Examples 1-20, to optionally include a video display module, comprising: a circuit board including a first face with a plurality of light emitting elements mounted to the first face and a second face configured for mounting to a support chassis; one or more first securing structures coupled to the second face, the one or more first securing structures being configured to mount or secure the circuit board to the support chassis; and one or more security latches each comprising a latch body movable between a latched position and an unlatched position, each latch body configured to engage a first feature of the support chassis to prevent removal of the video display module when in the latched position.

Example 22 can include, or can optionally be combined with the subject matter of one or any combination of Examples 1-21, to optionally include the latch body is configured to be biased toward the latched position.

Example 23 can include, or can optionally be combined with the subject matter of one or any combination of Examples 1-22, to optionally include one or more second securing structures differing from the first securing structures.

Example 24 can include, or can optionally be combined with the subject matter of one or any combination of Examples 1-23, to optionally include the one or more first securing structures comprise a first one of one or more magnets, one or more latches, one or more securing structures integral with the second face, and one or more fasteners, and the second securing structures comprises a second one of the one or more magnets, the one or more latches, the one or more securing structures integral with the second face, and the one or more fasteners.

Example 25 can include, or can optionally be combined with the subject matter of one or any combination of Examples 1-24, to optionally include one or more third securing structures differing from the first securing structures and the second securing structures.

Example 26 can include, or can optionally be combined with the subject matter of one or any combination of Examples 1-25, to optionally include the one or more first securing structures comprise a first one of one or more magnets, one or more latches, one or more securing structures integral with the second face, and one or more fasteners, the one or more second securing structures comprises a second one of the one or more magnets, the one or more latches, the one or more securing structures integral with the second face, and the one or more fasteners, and the one or more third securing structures comprise a third one of the one or more magnets, the one or more latches, the one or more securing structures integral with the second face, and the one or more fasteners.

Example 27 can include, or can optionally be combined with the subject matter of one or any combination of Examples 1-26, to optionally include one or more translating structures coupled to the second face, each translating structure configured to engage a second feature of the support chassis effectuating a translation of the video display module to avoid contact or interference with an adjacently-positioned video display module, mounted to the support chassis, during a mounting or a dismounting procedure.

Example 28 can include, or can optionally be combined with the subject matter of one or any combination of Examples 1-27, to optionally include the one or more security latches further comprises a mating structure engageable by the latch body, wherein the mating structure retains the latch body when the security latch is in an unlatched and a latched position.

Example 29 can include, or can optionally be combined with the subject matter of one or any combination of Examples 1-28, to optionally include the mating structure of each of the one or more security latches maintains an alignment of the latch body with respect to the second face when the latch body moves between the latched position and the unlatched position.

Example 30 can include, or can optionally be combined with the subject matter of one or any combination of Examples 1-29, to optionally include the mating structure is mountable to the second face of the circuit board.

Example 31 can include, or can optionally be combined with the subject matter of one or any combination of Examples 1-30, to optionally include the mating structure comprises a base and one or more brackets configured to retain a portion of the latch body.

Example 32 can include, or can optionally be combined with the subject matter of one or any combination of Examples 1-31, to optionally include the one or more brackets comprises a first member that is substantially orthogonal to the second face, the first member providing a stop for motion of the latch body from the unlatched position to the latched position, a second member that is substantially parallel to the second face, the second member being configured to retain a portion of the latch body.

Example 33 can include, or can optionally be combined with the subject matter of one or any combination of Examples 1-32, to optionally include the latch body is biased toward the latched position by a biasing structure.

Example 34 can include, or can optionally be combined with the subject matter of one or any combination of Examples 1-33, to optionally include the biasing structure comprises a spring.

Example 35 can include, or can optionally be combined with the subject matter of one or any combination of Examples 1-34, to optionally include the latch body further comprises a lower portion configured to fit inside the inner diameter of the spring.

Example 36 can include, or can optionally be combined with the subject matter of one or any combination of Examples 1-35, to optionally include the latch body comprises a ramped portion configured to engage the first feature of the support chassis during mounting of the video display module to push the latch body toward the unlatched position.

Example 37 can include, or can optionally be combined with the subject matter of one or any combination of Examples 1-36, to optionally include the latch body further comprises a front face proximate to the second face of the circuit board and an opposing rear face, a ramp between the front face and the rear face; and an opening in the front face to permit access to the ramp.

Example 38 can include, or can optionally be combined with the subject matter of one or any combination of Examples 1-37, to optionally include the frame further comprises a removal tool hole extending between the first face and the second face, the removal tool hole being substantially aligned with the opening in the front face of the latch body.

Example 39 can include, or can optionally be combined with the subject matter of one or any combination of Examples 1-38, to optionally include the removal tool hole is configured to receive a removal tool configured to engage the ramp to push the latch body from the latched position to the unlatched position.

Example 40 can include, or can optionally be combined with the subject matter of one or any combination of Examples 1-39, to optionally include the latch body further comprises one or more protrusions projecting outwardly from the latch body, wherein the one or more protrusions engage the mating structure in the security latch.

Example 41 can include, or can optionally be combined with the subject matter of one or any combination of Examples 1-40, to optionally include the one or more security latches are actuable from a front side of the video display module, the front side oriented in a direction of the first face.

Example 42 can include, or can optionally be combined with the subject matter of one or any combination of Examples 1-41, to optionally include a video display system comprising a support chassis; one or more video display modules, wherein each of the one or more video display modules includes: a circuit board including a first face with a plurality of light emitting elements mounted to the first face and a second face configured for mounting to a support chassis: one or more first securing structures coupled to the second face, the one or more first securing structures being configured to mount or secure the circuit board to the support chassis; and one or more security latches each comprising a latch body movable between a latched position and an unlatched position, each latch body configured to engage a first feature of the support chassis to prevent removal of the video display module when in the latched position.

Example 43 can include, or can optionally be combined with the subject matter of one or any combination of Examples 1-42, to optionally include the latch body is configured to be biased toward the latched position.

Example 44 can include, or can optionally be combined with the subject matter of one or any combination of Examples 1-43, to optionally include one or more second securing structures differing from the first securing structures.

Example 45 can include, or can optionally be combined with the subject matter of one or any combination of Examples 1-44, to optionally include the one or more first securing structures comprise a first one of one or more magnets, one or more latches, one or more securing structures integral with the second face, and one or more fasteners, and the second securing structures comprises a second one of the one or more magnets, the one or more latches, the one or more securing structures integral with the second face, and the one or more fasteners.

Example 46 can include, or can optionally be combined with the subject matter of one or any combination of Examples 1-45, to optionally include one or more third securing structures differing from the first securing structures and the second securing structures.

Example 47 can include, or can optionally be combined with the subject matter of one or any combination of Examples 1-46 to optionally include the one or more first securing structures comprise a first one of one or more magnets, one or more latches, one or more securing structures integral with the second face, and one or more fasteners, the one or more second securing structures comprises a second one of the one or more magnets, the one or more latches, the one or more securing structures integral with the second face, and the one or more fasteners, and the one or more third securing structures comprise a third one of the one or more magnets, the one or more latches, the one or more securing structures integral with the second face, and the one or more fasteners.

Example 48 can include, or can optionally be combined with the subject matter of one or any combination of Examples 1-47, to optionally include one or more translating structures coupled to the second face, each translating structure configured to engage a second feature of the support chassis effectuating a translation of the video display module to avoid contact or interference with an adjacently-positioned video display module, mounted to the support chassis, during a mounting or a dismounting procedure.

Example 49 can include, or can optionally be combined with the subject matter of one or any combination of Examples 1-48, to optionally include one or more security latches further comprises a mating structure engageable by the latch body, wherein the mating structure retains the latch body when the security latch is in an unlatched and a latched position.

Example 50 can include, or can optionally be combined with the subject matter of one or any combination of Examples 1-49, to optionally include the mating structure of each of the one or more security latches maintains an alignment of the latch body with respect to the second face when the latch body moves between the latched position and the unlatched position Example 51 can include, or can optionally be combined with the subject matter of one or any combination of Examples 1-50, to optionally include the mating structure is mountable to the second face of the circuit board.

Example 52 can include, or can optionally be combined with the subject matter of one or any combination of Examples 1-51, to optionally include the mating structure comprises a base and one or more brackets configured to retain a portion of the latch body.

Example 53 can include, or can optionally be combined with the subject matter of one or any combination of Examples 1-52, to optionally include each of the one or more brackets comprises a first member that is substantially orthogonal to the second face, the first member providing a stop for motion of the latch body from the unlatched position to the latched position, a second member that is substantially parallel to the second face, the second member being configured to retain a portion of the latch body.

Example 54 can include, or can optionally be combined with the subject matter of one or any combination of Examples 1-53, to optionally include the latch body is biased toward the latched position by a biasing structure.

Example 55 can include, or can optionally be combined with the subject matter of one or any combination of Examples 1-54, to optionally the biasing structure comprises a spring.

Example 56 can include, or can optionally be combined with the subject matter of one or any combination of Examples 1-55, to optionally include the latch body further comprises a lower portion configured to fit inside the inner diameter of the spring.

Example 57 can include, or can optionally be combined with the subject matter of one or any combination of Examples 1-56, to optionally include the latch body comprises a ramped portion configured to engage the first feature of the support chassis during mounting of the video display module to push the latch body toward the unlatched position.

Example 58 can include, or can optionally be combined with the subject matter of one or any combination of Examples 1-57, to optionally include the latch body further comprises a front face proximate to the second face of the circuit board and an opposing rear face, a ramp between the front face and the rear face; and an opening in the front face to permit access to the ramp.

Example 59 can include, or can optionally be combined with the subject matter of one or any combination of Examples 1-58, to optionally include the circuit board further comprises a removal tool hole extending between the first face and the second face, the removal tool hole being substantially aligned with the opening in the front face of the latch body and the removal tool hole providing a passageway from the front side of video display module, through the mating structure, and through the latch body.

Example 60 can include, or can optionally be combined with the subject matter of one or any combination of Examples 1-59, to optionally include the removal tool hole is configured to receive a removal tool configured to engage the ramp to push the latch body from the latched position to the unlatched position.

Example 61 can include, or can optionally be combined with the subject matter of one or any combination of Examples 1-60, to optionally include the latch body further comprises one or more protrusions projecting outwardly from the latch body, wherein the one or more protrusions engage the mating structure in the security latch.

Example 62 can include, or can optionally be combined with the subject matter of one or any combination of Examples 1-61, to optionally include the one or more security latches are actuable from a front side of the video display module, the front side oriented in a direction of the first face of the circuit board.

Example 63 can include, or can optionally be combined with the subject matter of one or any combination of Examples 1-62, to optionally include a removal tool, wherein the removal tool includes a latching structure on a distal end.

Example 64 can include, or can optionally be combined with the subject matter of one or any combination of Examples 1-63 to optionally include the support chassis comprises a support structure, and an opening for each of the one or more video display modules.

Example 65 can include, or can optionally be combined with the subject matter of one or any combination of Examples 1-64, to optionally include the support structure is movable on wheels.

The above Detailed Description is intended to be illustrative, and not restrictive. For example, the above-described examples (or one or more elements thereof) can be used in combination with each other. Other embodiments can be used, such as by one of ordinary skill in the art upon reviewing the above description. Also, various features or elements can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B." "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first." "second." and "third," etc. are used merely as labels, and are not intended to impose numerical requirements on their objects.

Method examples described herein can be machine or computer-implemented, at least in part. Some examples can include a computer-readable medium or machine-readable medium encoded with instructions operable to configure an electronic device to perform methods or method steps as described in the above examples. An implementation of such methods or method steps can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

What is claimed is:

1. A display system, comprising:
   a display module including a first module face, a second module face, and a plurality of light-emitting elements mounted to the first module face;
   one or more first securing structures coupled to the display module to mount or secure the display module to one or more support structures; and
   a security latch coupled to the display module, the security latch comprising;
      a latch body that moves relative to the display module between a latched position and an unlatched position, and
      a biasing structure that creates a biasing force that biases the latch body in a biasing direction toward the latched position,
      wherein the latch body comprises a ramped portion that engages an engagement surface on the one or more support structures, wherein the engagement between the engagement surface and the ramped portion exerts an unlatching force on the latch body to move the latch body in an unlatching direction that is substantially opposite to the biasing direction and to push against the biasing force to move the latch body to the unlatched position, and wherein, upon disengagement between the ramped portion and the engagement surface, the biasing force of the biasing structure moves the latch body in the biasing direction to the latched position so that the latch body engages a feature of the one or more support structures to prevent disengagement of the display module from the one or more support structures.

2. The display system of claim 1, wherein the security latch further comprises a mating structure that retains the latch body to maintain an alignment of the latch body relative to the display module during movement of the latch body between the latched position and the unlatched position.

3. The display system of claim 2, wherein the mating structure is mounted to the second module face.

4. The display system of claim 1, wherein the biasing structure comprises a spring.

5. The display system of claim 4, wherein the spring comprises an inner diameter and an outer diameter, and wherein the latch body comprises a portion configured to fit inside an inner diameter of the spring.

6. The display system of claim 1, wherein the latch body further comprises:
   a front latch face facing toward the second module face and an opposing rear latch face;
   a second ramped portion extending at least partially between the front latch face and the rear latch face; and
   a channel extending from at least one of the front latch face and the rear latch face to permit access for a removal tool to exert a second unlatching force on the second ramped portion that moves the latch body in the unlatching direction to push against the biasing force and to move the latch body to the unlatched position.

7. The display system of claim 6, wherein the channel permits the removal tool access to the second ramped portion in a tool access direction that is substantially normal to the first module surface and the second module surface.

8. The display system of claim 6, wherein the display module further comprises a removal tool hole extending between the first module face and the second module face, wherein the removal tool hole is at least partially aligned with the channel, and wherein the removal tool hole receives the removal tool and allows the removal tool to access the channel and exert the second unlatching force on the second ramped portion.

9. The display system of claim 1, wherein the one or more first securing structures comprise at least one of: one or more magnets, one or more primary latches, one or more securing structures integral with the second module face, or one or more fasteners.

10. The display system of claim 1, wherein the security latch is actuable from a front side of the display module.

11. The display system of claim 1, wherein the latch body further comprises a handle that can be manipulated by a user to push the latch body against the biasing force and to move the latch body to the unlatched position.

12. A method comprising:
   providing or receiving a module assembly that includes;
      a display module including a first module face, a second module face, and a plurality of light-emitting elements mounted to the first module face, and
      a security latch coupled to the display module, the security latch comprising;
         a latch body that moves relative to the display module between a latched position and an unlatched position, and
         a biasing structure that creates a biasing force that biases the latch body in a biasing direction toward the latched position;
   mounting the module assembly to one or more support structures, wherein the mounting includes:
      moving the module assembly so that the ramped portion engages an engagement surface on the one or more support structures such that the engagement surface pushes on the ramped portion to exert an pushing force on the latch body in an unlatching direction that is substantially opposite to the biasing direction and that counters the biasing force to move the latch body to the unlatched position,
      while the latch body is in the unlatched position, moving the module assembly into a mounted position relative to the one or more support structures, wherein once the module assembly is in or proximate to the mounted position, the ramped portion becomes disengaged from the engagement surface so that the biasing force of the biasing structure moves the latch body in the biasing direction to the latched position so that the latch body engages a feature of the one or more support structures to prevent disengagement of the display module from the one or more support structures, and
      securing the module assembly to the one or more support structures with one or more first securing structures.

13. The method of claim 12, further comprising, after mounting the module assembly to the one or more support structures, dismounting the module assembly from the one or more support structures, the dismounting comprising:

disengaging the one or more first securing structures from one or both of the module assembly or the one or more support structures;

moving the latch body in the unlatching direction against the biasing force from the latched position to the unlatched position; and separating the module assembly from the one or more supporting structures.

14. The method of claim 13, wherein the latch body further comprises a handle, and wherein moving the latch body in the unlatching direction comprises manipulating the handle.

15. The method of claim 13, wherein the moving the latch body in the unlatching direction during the dismounting comprises engaging the latch body with a removal tool so that the removal tool moves the latch body in the unlatching direction from the latched position to the unlatched position.

16. The method of claim 15, wherein the latch body further comprises a front latch face facing toward the second module face and an opposing rear latch face, a second ramped portion extending at least partially between the front latch face and the rear latch face, and a channel extending from at least one of the front latch face and the rear ramped face; and wherein the moving the latch body in the unlatching direction during the dismounting includes inserting at least a portion of the removal tool into the channel and exerting the second unlatching force onto the second ramped portion with the removal tool.

17. The method of claim 16, wherein the display module further comprises a removal tool hole extending between the first module face and the second module face, wherein the removal tool hole is at least partially aligned with the opening in the front latch face, and wherein the moving the latch body in the unlatching direction during the dismounting comprises inserting at least a portion of the removal tool through the removal tool hole and into the channel and exerting the second unlatching force onto the second ramped portion with the removal tool.

18. The method of claim 12, wherein the biasing structure comprises a spring.

19. The method of claim 12, wherein the one or more first securing structures comprise at least one of: one or more magnets, one or more primary latches, one or more securing structures integral with the second module face, or one or more fasteners.

* * * * *